(12) United States Patent
Wong et al.

(10) Patent No.: US 7,149,178 B2
(45) Date of Patent: Dec. 12, 2006

(54) METHOD AND FORMAT FOR READING AND WRITING IN A MULTILEVEL OPTICAL DATA SYSTEMS

(75) Inventors: Terrence L. Wong, San Francisco, CA (US); Gregory S. Lewis, Berkeley, CA (US); David C. Lee, Hong Kong (CN); Yi Ling, Foster City, CA (US); Stephen P. Pope, Berkeley, CA (US); Steven R. Spielman, Berkeley, CA (US); Jonathan A. Zingman, Oakland, CA (US)

(73) Assignee: LSI Logic Corporation, Milpitas, CA (US)

( * ) Notice: Subject to any disclaimer, the term of this patent is extended or adjusted under 35 U.S.C. 154(b) by 336 days.

(21) Appl. No.: 10/877,374

(22) Filed: Jun. 25, 2004

(65) Prior Publication Data

US 2004/0233815 A1 Nov. 25, 2004

Related U.S. Application Data

(60) Division of application No. 09/476,395, filed on Dec. 30, 1999, now Pat. No. 6,771,570, which is a continuation-in-part of application No. 09/253,808, filed on Feb. 18, 1999, now Pat. No. 6,275,458.

(51) Int. Cl.
*G11B 7/24* (2006.01)
(52) U.S. Cl. .................................................. 369/275.3
(58) Field of Classification Search ..................... None
See application file for complete search history.

(56) References Cited

U.S. PATENT DOCUMENTS

| 5,144,615 A | 9/1992 | Kobayashi | 369/116 |
| 5,500,848 A | 3/1996 | Best et al. | 369/275.3 |
| 5,537,382 A | 7/1996 | McLaughlin | 369/116 |
| 5,719,843 A | 2/1998 | Nakajima et al. | |
| 5,835,462 A | 11/1998 | Mimnagh | 369/47.39 |

OTHER PUBLICATIONS

Parker, Dana, J., "The Many Faces of High Density", EMEDIA Professional, Jan. 1998, pp. 60-71; http://www.onlineinc.com/emedia.

Coombs, J.H., et al, "Laser-induced crystallization phenomena in GeTe-based alloys", J. Appl. Phys 78(8), Oct. 15, 1995, pp. 4906-5917.

*Primary Examiner*—Paul W. Huber
(74) *Attorney, Agent, or Firm*—Christopher P. Maiorana PC

(57) ABSTRACT

A system and method for reading and writing in a multilevel optical data system is disclosed. The system provides control signals for timing acquisition, level calibration, DC control, AGC, equalizer training and data synchronization. The user data is ECC protected and optionally convolutionally encoded before being combined with the control signals in an information block. The multilevel information block can be written to an optical disc as a series of multilevel marks. The optical disc may also contain an Address in Pregroove signal (AIP) to facilitate synchronization during writing of an information block. The AIP signal has an integer number of address frames per information block.

20 Claims, 14 Drawing Sheets

| Clock Alignment Acquisition | Level Calibration | Equalizer Training | Block Address |

Preamble format

Preamble format a address
b ECC data synch
c timing fields
d AGC
e DC
f ECC
g data
h trellis clean up Data block / ECC Format c timing fields
g filler data
h trellis clean up
e DC control
d AGC fields Postamble format

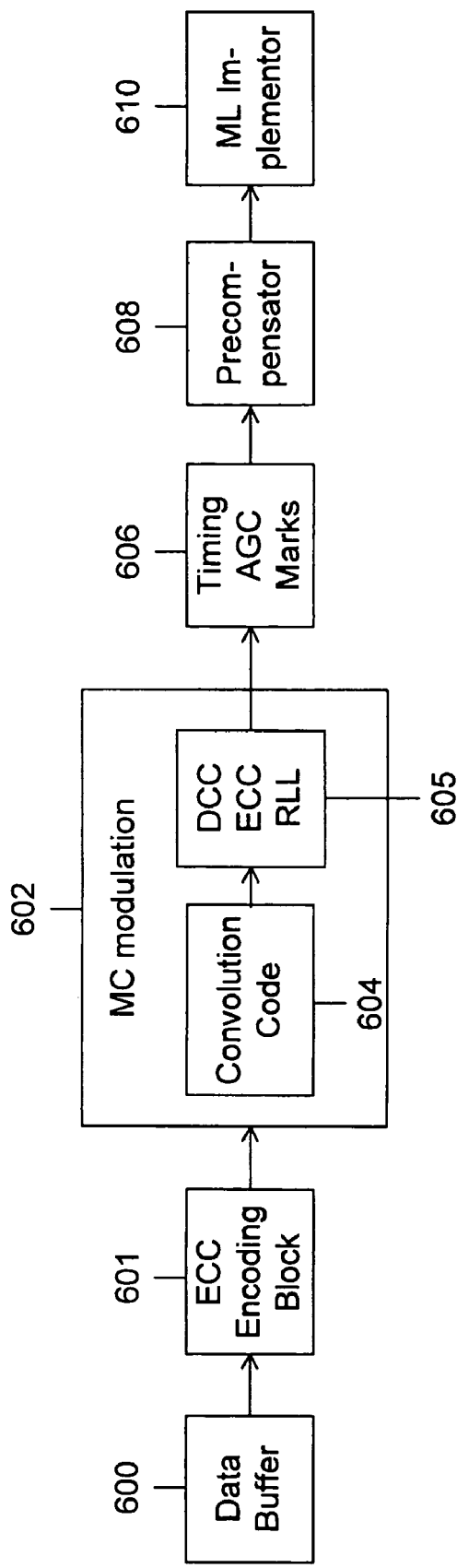

Figure 9

| Marks | 16 | 48 | 32 |
|---|---|---|---|
| Purpose (bit labels) | Reserved (bits $b_{31}..b_{24}$) — 915 | Physical Block Number (bits $b_{23}..b_0$) — 905 | IED (bits $c_{15}..c_0$) — 910 |

Figure 10

| Marks | 10 | 1 | 76 | 20 | 10 | 20 | 37 | 10 | 76 | 1 |
|---|---|---|---|---|---|---|---|---|---|---|
| Purpose | A/T$_N$ | OM 1 | Address Information 1 | Address Information 2 | A/T$_P$ | Address Information A | OM 2 | A/T$_N$ | Address Information B | OM 3 |

SCR0-14: Sector Closeouts and Resynchs

| Marks | 10 | 18 | 320 |
|---|---|---|---|
| Purpose | A/T$_P$ | Sector Closeout | Timing Resynch |

1105 — 1110 — 1115

| 1405 | 1410 | 1405 |
|---|---|---|
| Lead-In with AIP addressing and special information | Data Area with AIP addressing | Lead-Out with AIP addressing |

Figure 14

| Number of bits | 7 (bits 1-7) | 4 (bits 8-11) | 8 (bits 12-19) | 8 (bits 20-27) | 8 (bits 28-35) | 14 (bits 36-49) |
|---|---|---|---|---|---|---|
| Data | Synch | Special Info Area | AddressC | AddressB | AddressA | CRC remainder |

Figure 15  1505

| AIP Block Type 0 | Physical Block (5 AIP Frames) | | | | |
|---|---|---|---|---|---|
| AIP Frame | 1 | 2 | 3 | 4 | 5 |
| Information in Reserve bits (bits 8-11 of AIP frame) | 1111 | B1, B2, AA1, AA2 | D1, D2, D3, D4 | U1, U2, U3, U4 | N1, N2, AB1, AB2 |

1605  Figure 16

| AIP Block Type 1 | Physical Block (5 AIP Frames) | | | | |
|---|---|---|---|---|---|
| AIP Frame | 1 | 2 | 3 | 4 | 5 |
| Information in Reserve bits (bits 8-11 of AIP frame) | B1, B2, S1, S2 | PM1, PM2, PM3, PM4 | PG1, PG2, PG3, PG4 | AC1, AC2, AC3, AC4 | AC5, AC6, AC7, AC8 |

Figure 17

| AIP Block Type 2 | Physical Block (5 AIP Frames) | | | | |
|---|---|---|---|---|---|
| AIP Frame | 1 | 2 | 3 | 4 | 5 |
| Information in Reserve bits (bits 8-11 of AIP Frame) | B1, B2, S1, S2 | TM1, TM2, TM3, TM4 | TB1, TB2, TB3 TB4 | TT1, TT2, TT3, TT4 | AD1, AD2, AD3, AD4 |

METHOD AND FORMAT FOR READING AND WRITING IN A MULTILEVEL OPTICAL DATA SYSTEMS

This is a divisional of U.S. application Ser. No. 09/476,395, filed Dec. 30, 1999, now U.S. Pat. No. 6,771,570 which is a continuation-in-part of U.S. application Ser. No. 09/253,808, filed Feb. 18, 1999, now U.S. Pat. No. 6,275,458.

BACKGROUND OF THE INVENTION

1. Field of the Invention

The present invention relates generally to reading multilevel signals from an optical disc and writing multilevel signals to an optical disc. Methods and apparatuses are described for processing signals that are eventually written to and read from an optical disc. These signals produce marks on the optical disc that may vary in both reflectivity and length. The system disclosed provides a method of encoding and decoding the data, correcting for errors, synchronizing the data, controlling the DC content, establishing and recovering a clock signal, establishing and recovering the envelope of the signal, and compensating for signal distortion.

2. Relationship to the Art

In order to increase the capacity and speed of optical data storage systems, multilevel optical recording systems have been developed. It should be noted that in this specification, the term multilevel is used to indicate greater than 2 levels. In a traditional optical recording system, reflectivity of the recording media is modulated between two states. The density of data recorded on an optical recording medium may be increased by modulating the reflectivity of the optical recording medium into more than two states.

One type of optical recording medium that appears to be particularly suitable for multilevel signal modulation is phase change optical material. When a phase change material is heated by a writing laser, the reflectivity of the phase change material may be changed. The change in reflectivity may be controlled by adjusting the amount of heating of the material and the rate at which the material cools. This process is described further in "Laser-induced crystallization phenomena in GeTe-based alloys. I. Characterization on nucleation and growth" (J. Appl. Phys. 78 (8), 15 Oct. 1995. p.4906) by J. H. Coombs, et. al. (hereinafter "Coombs").

After a phase change optical disc has been written, the intensity of a beam of light reflected from the disc is measured so that the multilevel data written to the disc may be recovered. U.S. Pat. No. 5,144,615 entitled APPARATUS AND METHOD FOR RECORDING AND REPRODUCING MULTILEVEL INFORMATION issued to Kobayashi (hereinafter "Kobayashi") discloses a system for recovering multilevel data from such an optical disc. FIG. 1 is a block diagram illustrating the system disclosed in Kobayashi for recovering such data. Analog data read from a detector is input from a mark length detecting circuit 101 and a reflectivity detecting circuit 102. The outputs of these circuits are sent to an analog-to-digital (A/D) converter 103. The A/D converter 103 includes an n-value circuit which determines the value that the signal corresponds to by comparing the signal to predetermined reference voltages. Subsequently, the n-value signal is converted into a binary signal by binary circuit 405.

While this system discloses the concept of reading a multilevel signal and converting it into a digital signal in a basic sense, no method is disclosed of handling various imperfections in optically read multilevel signals that in fact tend to occur. For example, it is not clear how a clock is recovered for the purpose of precisely detecting mark lengths and no method is disclosed for handling problems that tend to occur in real systems such as amplitude modulation and DC offset of the optically detected signal and noise.

In a conventional two level optical data storage system, information is stored in the lengths of the marks and the spaces between them. So long as the edge of a mark can be detected with enough precision to distinguish between marks that differ in length by a minimum allowed amount, the system can operate reliably. This edge transition between one reflectivity state and another can be detected by setting a threshold value and determining the time when the signal crosses the threshold. Slow amplitude variations that might interfere with this edge detection are removed by AC coupling the photodetector signal before the threshold detection circuit. Mark and space lengths are measured by counting how many clock periods are between the edge transitions. The reader clock periods are synchronized to the mark/space edges, thus ensuring that there are an integral number of clock periods in each mark/space.

In contrast, in a multilevel recording system, the amplitude of the signal carries information. The reader interprets the data signal to determine the amplitude of the signal at certain times. Therefore, the reader clock must be synchronized to the data stream to ensure that the reader is interpreting the signal at the proper time. Because of the blurring effect of the optics in a reader, the transitions between the different levels do not create sharp edges. It is therefore difficult to synchronize the reader clock to the data stream. A method of precisely aligning a read data stream is needed. Further, a multilevel system is more sensitive to fluctuations in the overall envelope of the data signal. AC coupling alone is not adequate to enable a sufficiently precise determination of the different amplitude signals. Another problem encountered in a multilevel optical disc system is DC compensation.

In order for a multilevel optical read system to reliably record and recover data, a method of handling these sources of error in reading an optical signal is needed.

SUMMARY OF THE INVENTION

Accordingly, a system for writing and reading multilevel marks on an optical disc is disclosed. The system includes an error correction encoding and decoding system, modulation and demodulation system, DC control system, amplitude correction circuit, a clock recovery circuit, a write strategy system a system to focus and track the laser spot on the surface of the disc, a system to rotate the disc, and an interface to a computer system. It should be appreciated that the present invention can be implemented in numerous ways, including as a process, an apparatus, a system, a device, a method, or a computer readable medium that includes certain types of marks that enable reliable data storage and recovery. Several inventive embodiments of the present invention are described below.

In one embodiment, an information block in a multilevel optical data system is disclosed. The information block includes a preamble having a timing acquisition area, a preamble level calibration area, and an equalizer training area. The information block also has a data block and a postamble.

In one embodiment, an information block in a multilevel optical data system is disclosed. The information block has a preamble that includes a timing acquisition area, a preamble level calibration area and a preamble equalizer training area. The information block also includes a first data block, a midamble including a midamble level calibration area and a midamble equalizer training area. The information block further includes a second data block and a postamble.

In one embodiment, a multilevel pattern of marks written to an optical disc is disclosed. The multilevel pattern includes a preamble having a timing acquisition area, a preamble level calibration area and an equalizer training area. The multilevel pattern also has a data block and a postamble.

In one embodiment, a multilevel pattern of marks written to an optical disc is disclosed. The multilevel pattern has a preamble including a timing acquisition area, a preamble level calibration area and a preamble equalizer training area. The multilevel pattern also has a first data block and a midamble including a midamble level calibration area and a midamble equalizer training area. The multilevel pattern further includes a second data block and a postamble.

In one embodiment, a method is disclosed for writing an information block in a multilevel optical data system. The method has the steps of defining a preamble including the steps of providing a timing acquisition area, inserting a preamble level calibration area and adding an equalizer training area. The method also includes adding a data block and appending a postamble.

In one embodiment, a method of writing an information block in a multilevel optical data system is disclosed. The method includes the steps of defining a preamble having the steps of providing a timing acquisition area, inserting a preamble level calibration area and adding an equalizer training area. The method also includes adding a first data block, and defining a midamble having the steps of inserting a midamble level calibration area and adding a midamble equalizer training area. The method further includes adding a second data block and appending a postamble.

In one embodiment, a format for an address in pregroove (AIP) in a multilevel optical disc system is adapted to storing or retrieving data arranged in physical information blocks having physical information block addresses. The format has a lead-in area, data area and lead-out area. The format includes a plurality of AIP frames. An integer number of the AIP frames correspond to each of the physical information blocks and are arranged as AIP blocks. Each of the AIP frames contains an AIP address where the AIP address relates to said physical information block address by the equation INT(AIP address/integer number)=physical information block address. The format also includes a special information area contained in the AIP frames in the lead-in area.

These and other features and advantages of the present invention will be presented in more detail in the following specification of the invention and the accompanying figures which illustrate by way of example the principles of the invention.

BRIEF DISCRIPTION OF THE DRAWINGS

The present invention will be readily understood by the following detailed description in conjunction with the accompanying drawings, wherein like reference numerals designate like structural elements, and in which:

FIG. 6 is a block diagram illustrating a system for writing multilevel marks to a disc.

FIG. 7 is a block diagram of the three main areas of a 120 mm optical disc.

FIG. 9 is a diagram of the information stored in the block address.

FIG. 10 is a diagram showing the block address mark arrangment.

FIG. 11 shows the mark arrangement for the Sector Closeout and Timing Resynchs.

FIG. 14 shows the three main areas of the Address In Pregrove (AIP) format.

FIG. 15 depicts the contents of an AIP frame.

FIG. 16 illustrates a type 0 AIP frame.

FIG. 17 illustrates a type 1 AIP frame.

DETAILED DISCRIPTION

Reference will now be made in detail to the preferred embodiment of the invention. An example of the preferred embodiment is illustrated in the accompanying drawings. While the invention will be described in conjunction with that preferred embodiment, it will be understood that it is not intended to limit the invention to one preferred embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 1:
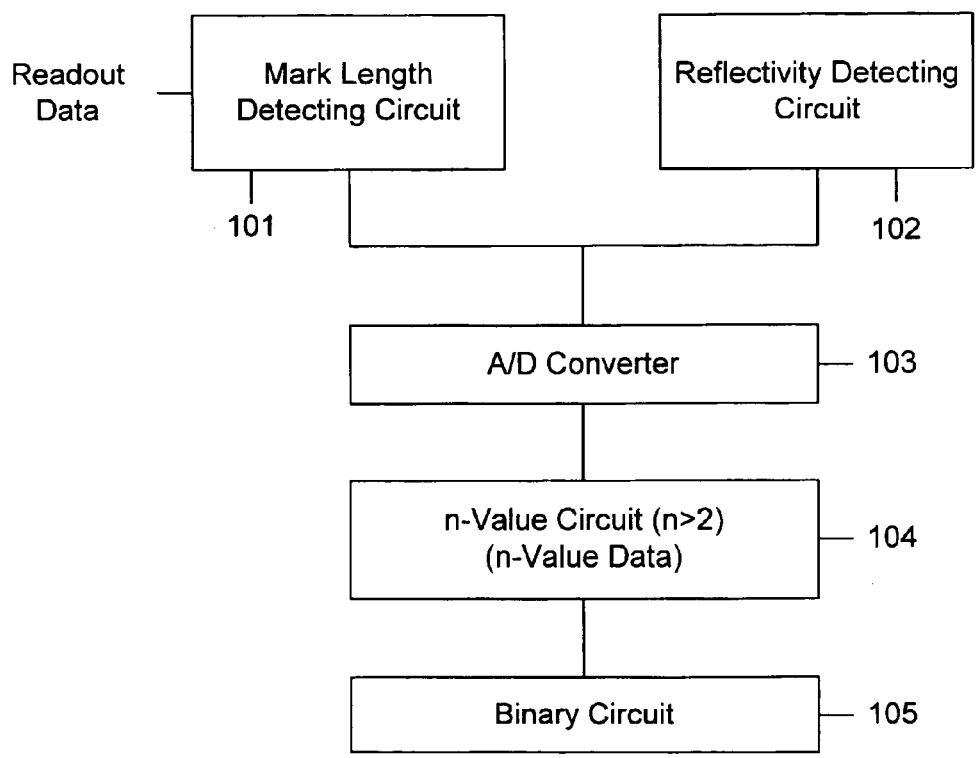
FIG. 1 is a block diagram illustrating the system disclosed in Kobayashi for recovering such data.
Figure 2:
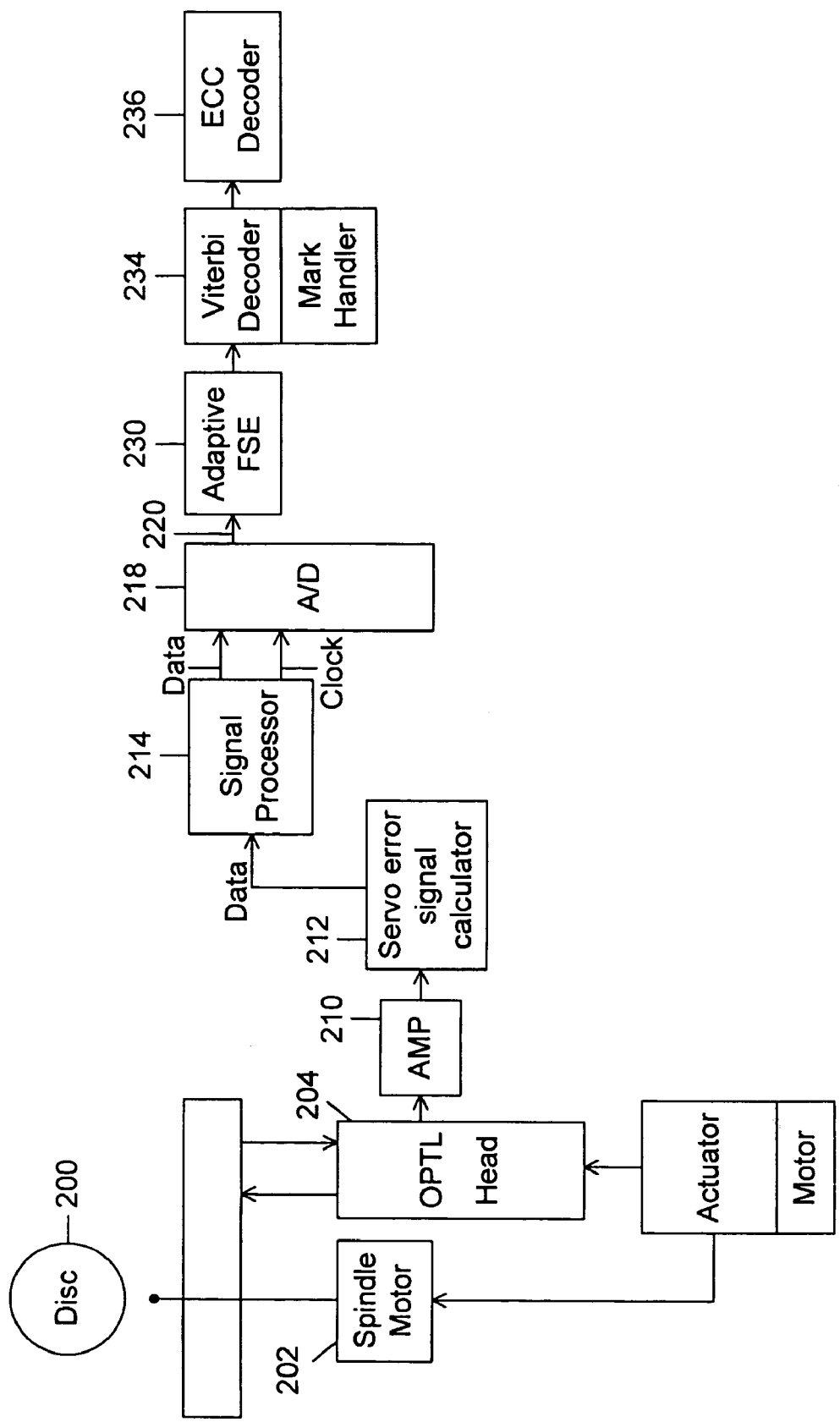
FIG. 2 is a block diagram of a system for reading a multilevel signal from an optical disc.

FIG. 2 is a block diagram of a system for reading a multilevel signal from an optical disc. A disc 200 is rotated by a motor 202. An optical head 204 includes a laser that illuminates a storage location on the disc and a multielement photodetector that detects the reflected light from the location. The optical disc contains a multilevel modulated signal. The multilevel signal may be written to the optical disc in different embodiments using various techniques for changing the reflectivity of the disc including varying pit depth, varying the exposure of a dye, or changing the phase of an optical phase change material. In the example illustrated below, an optical phase change material is used. The photodetector converts the light into an electrical signal which is converted from a current to a voltage and amplified by an pre-amplifier 210. The output of the pre-amplifier 210 is fed to a servo error-signal calculator 212 that calculates combinations of the signal for the focus, tracking, and data interpretation systems. The data signal contains the multilevel information and in prior art systems such as the one described above, the amplified data is input into an A/D converter for the purpose of digitizing that information. An improved system is disclosed herein that includes various signal processing stages between the amplifier and the A/D converter as well as after the A/D converter.

The signal from servo error-signal calculator 212 is input to a signal processing system 214 before it is input into an analog to digital (A/D) converter 218. The signal processing system 214 is further described in FIG. 3. In addition to the processed data signal, a clock signal is generated by signal processing system 214 and the clock signal is also provided to A/D converter 218. The digitized output signal 220 from the A/D converter is input into an adaptive fractionally spaced equalizer (FSE) 230. This adaptive FSE shapes the frequency response of the data signal so that the data channel collectively gives a specific amount of intersymbol interference. In addition, the adaptive nature of the FSE allows the system to accommodate interchange of media and players and inhomogeneities in the media. The output of the adaptive FSE is input into a Viterbi decoder 234 that includes a mark handler. In another embodiment, the mark handler could be separate from the Viterbi or other decoder used.

The mark handler is used to separate special timing and gain control fields, DC control fields, and other fields that do not carry data from storage locations on the disc that actually represent data. Timing and gain control fields are described below. DC control fields are periodically written to the disc to adjust the average signal level written to the disc so that low frequency content of the signal is suppressed. These DC control fields do not carry data information and are used simply to avoid having a DC bias on the read signal.

The Viterbi decoder recovers the sequence of data encoded on the disc. The output of the Viterbi decoder is input to an error correction code decoder 236 and the output data from the error correction code decoder is made available to the system reading data from the optical disc.

Figure 3A:
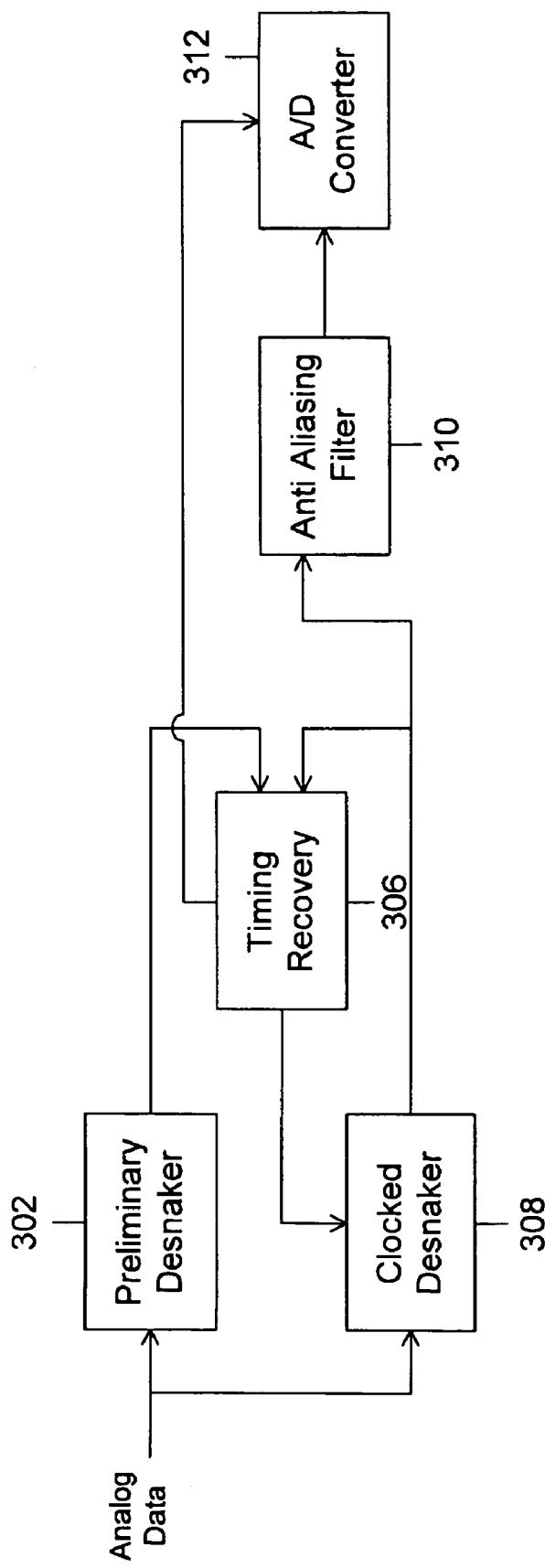
FIG. 3A is a block diagram illustrating the components of a signal processing system.

FIG. 3A is a block diagram illustrating a desnaker that may be included in the components of signal processing system 214. An analog signal is fed into a preliminary desnaker 302 and also to a clocked desnaker 308. The purpose of the desnaker is to remove the effect of amplitude modulation on the signal. The desnaker removes modulation in the envelope of the signal caused by variations in the characteristics of the optical disc or mechanical variations. For example, disc warp may cause amplitude modulation of the read signal separate from the recorded data. Also, the amount of phase change optical material deposited may vary, or there may be variations in the index of refraction or the thickness of the polycarbonate material covering the surface of the disc. These variations in the envelope of the data signal cause data read errors as well as timing errors.

Figure 4:
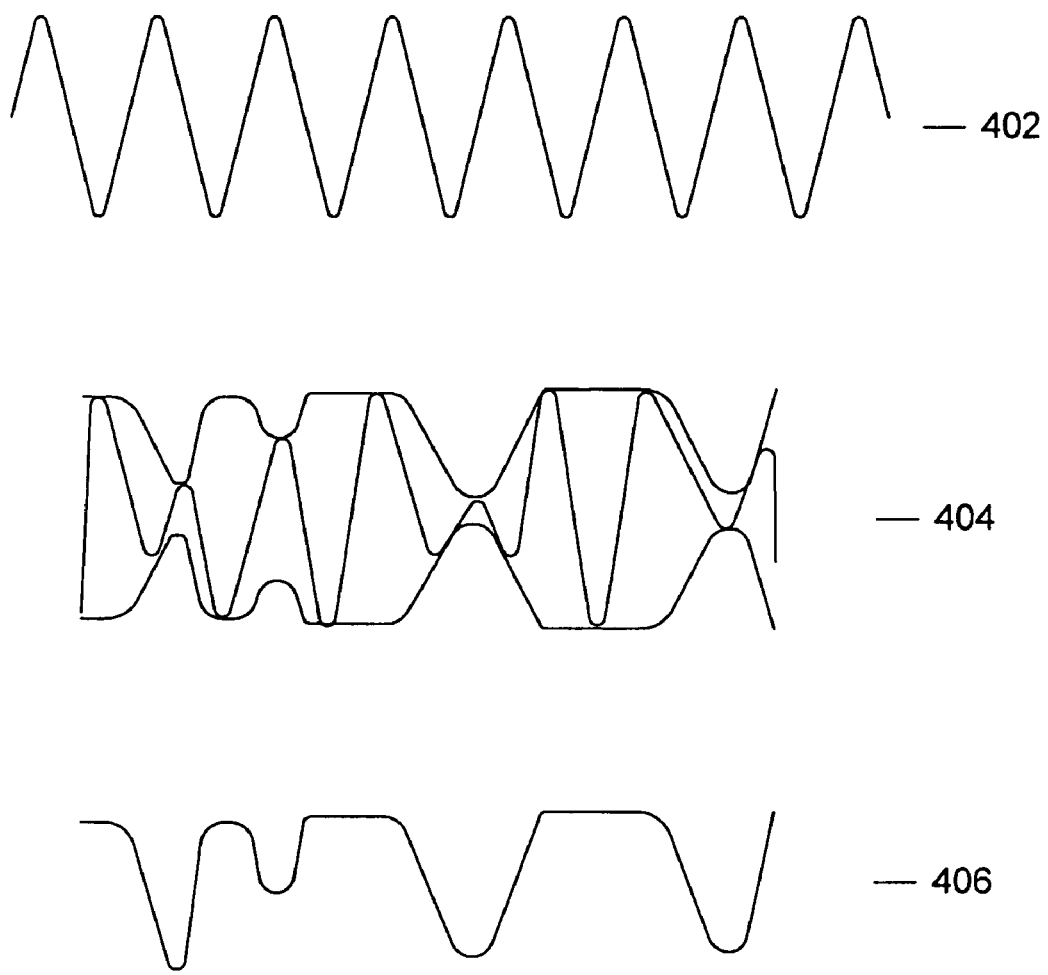
FIG. 4 illustrates how the preliminary desnaker processes an amplitude modulated signal.

FIG. 4 illustrates how the preliminary desnaker processes an amplitude modulated signal. The desired signal 402 does not have variation in its envelope. A raw signal 404 typically has some variation in its envelope. This varying envelope resembles the shape of a snake, hence the term "desnaking". In one embodiment, the envelope variation is removed by using top and bottom envelope detector circuits. The output of a top envelope detector circuit applied to amplitude modulated signal 404 is shown as signal 406. Signal 406 follows the peaks of the raw signal. Similarly, the output of a bottom envelope detector circuit follows the minimums of the raw signal.

The top and bottom envelope detection circuit outputs are used to normalize the amplitude. The amplitude modulation is removed by subtracting off the bottom signal from the data signal and then dividing by top minus bottom. In other words, the offset is subtracted off of the data signal, and then the amplitude is normalized. The design of peak detectors is described in The Art of Electronics by Horowitz and Hill which is herein incorporated by reference.

The output of preliminary desnaker 302 is input into a timing recovery system 306 for the acquisition of timing fields. Timing recovery circuit 306 acquires synchronization to timing fields that are included in the data signal and generates a sample clock. In one embodiment, a timing field includes a series of storage locations, or marks, written with specific values. Specifically, a timing field can include three storage locations written at the highest mark signal level followed by three storage locations written at the lowest mark signal level. In other embodiments, timing recovery can also be achieved by synchronizing to the data marks without specific timing fields being embedded in the data signal.

A timing field may also be three storage locations written at the lowest level followed by three storage locations written at the highest level. The difference between the high to low transition timing fields and the low to high transition timing fields is used to distinguish the fields. In addition, in one embodiment, every fourth timing field is five storage positions written at the highest level followed by five storage positions written at the lowest level or five storage positions written at the lowest followed by five storage positions written at the highest level. The extra long timing field that is ten storage positions long is also used as an amplitude automatic gain control field. The automatic gain control fields are used to more accurately desnake or remove the amplitude modulation of the envelope of the data signal.

Once the clock recovery circuit has locked to the timing fields, the clocked desnaker is used to more accurately desnake the signal. The clocked desnaker 308 receives an input from the timing recovery circuit and also receives the raw data signal from the optical detector. The clock desnaker 308 performs a more accurate removal of the amplitude modulation on the signal because the clocked desnaker uses the clock signal recovered by the clock recovery circuit to determine a point near the center of either a high region or low region of the automatic gain control field. Such a point gives a reliable measure of the full amplitude response of the media at that location, since intersymbol interference from neighboring marks of different levels is reduced or eliminated. Amplitude modulation of the signal is removed again by subtracting off the offset of the signal and by multiplying the signal by a value that is inversely proportional to the amplitude detected. Other methods of correcting for the amplitude modulation may be used that use the signal read from the automatic gain control field.

Thus, the amplitude modulation is initially removed using a preliminary desnaker and the output of the preliminary desnaker is used to acquire a clock signal. Once the clock signal is acquired, the clock signal is used to locate portions of the raw data signal that include automatic gain control (AGC) fields. The signal read at the automatic gain control field locations is used to more precisely compensate for amplitude modulation that occurs on the disc. The more precise compensation is performed by the clocked desnaker, and the output of the clocked desnaker is then used by the system.

The clocked desnaker uses the timing information obtained by the clock recovery circuit to accurately desnake the signal based on the signal read at the positions of the automatic gain control fields. This arrangement of a preliminary desnaker that facilitates the clock recovery and a second desnaker using the signal obtained from automatic gain control fields yields particularly good results. In other embodiments, different desnaking systems are used.

In one embodiment, a first preliminary desnaker is used that is similar to the preliminary desnaker described above. However, instead of a second clocked desnaker that operates on the read analog signal, the read analog signal is digitized and a digital desnaker is used to precisely desnake the data. In such an embodiment, the number of bits of resolution of the digitized read signal exceeds the number of bits of data that are encoded in the signal. In other embodiments, the raw analog signal is digitized without analog desnaking and all desnaking occurs in the digital domain.

In another embodiment, the preliminary desnaker is connected in series with the clocked desnaker. The clocked desnaker then operates on data that has been processed by the preliminary desnaker. The clocked desnaker may be either digital or analog.

Referring back to FIG. 3A, the signal output from the clocked desnaker is input into an anti-aliasing filter 310 and the output of the anti-aliasing filter 310 is input to an analog to digital (A/D) converter 312. A clock signal from the timing recovery system is also input to the analog to digital converter. The clock signal is used by the A/D converter to determine when to digitize the data signal. This digitized signal is then fed to FSE 230 shown in FIG. 2. It has been discovered that the analog desnaking prior to digitization may significantly improve system performance in some cases. In an alternate embodiment, the data signal is digitized by the A/D converter with only the preliminary desnaker or with no desnaking. This signal is then desnaked in the digital domain using a similar algorithm based on the measurement of the automatic gain control field signal levels.

Figure 3B:
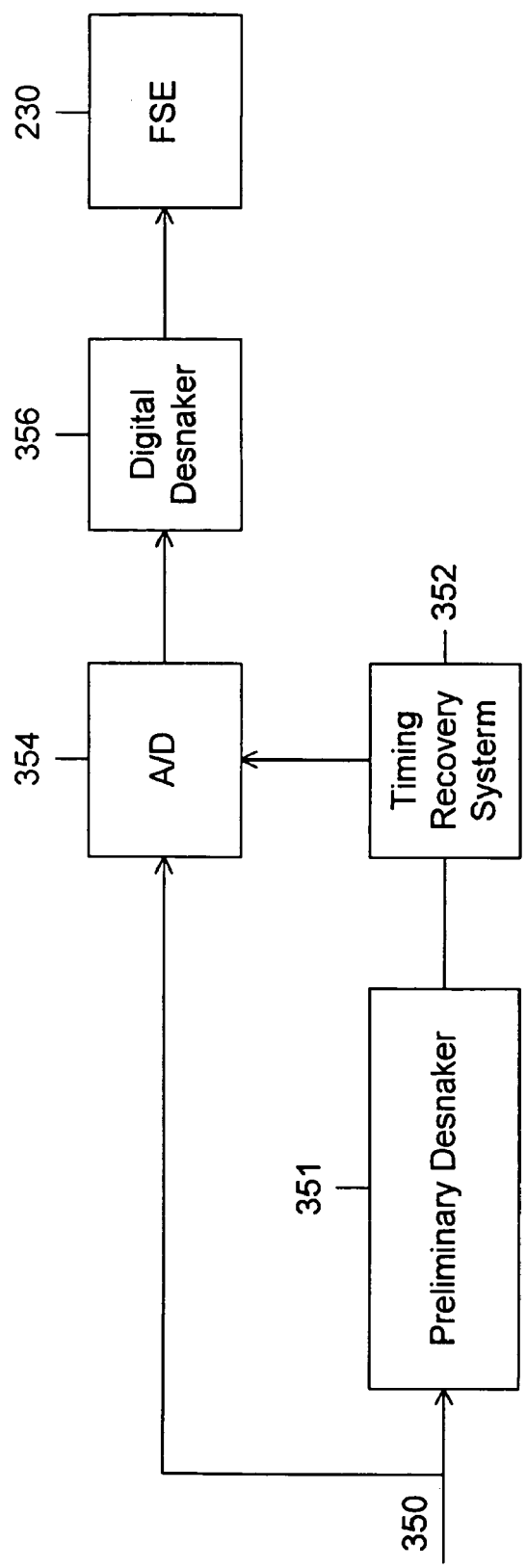
FIG. 3B is a block diagram illustrating an alternative desnaking architecture.

FIG. 3B is a block diagram illustrating an alternative desnaking architecture. A read signal 350 is input to a preliminary desnaker 351. Timing information is derived from the output of the preliminary desnaker by a timing recovery system 352 and the timing information is used to generate a clock for an analog to digital converter 354, which digitizes the read signal. The output of analog to digital converter 354 is input to a digital desnaker 356 that processes the signal to perform desnaking in the digital domain. Desnaking is performed digitally by analyzing recovered signal peak values and making adjustments to the signal to correct for detected signal amplitude variation. As in the clocked analog desnaker, automatic gain control marks may be used. The output of analog to digital converter 354 is input to FSE 230. In one embodiment, the analog to digital converter is a 12 bit analog to digital converter and the FSE derives 8 levels of data.

In one embodiment, FSE is a finite impulse response (FIR) filter with two taps for each mark. The equalizer is designed to shape the response of the channel to a specific equalization target. In one embodiment, the equalization target has a 1+D target transfer function. That is, the target output signal after passing through the optical data channel and equalization is equal to the input signal plus the input signal delayed by a time interval. The fractionally spaced equalizer has two advantages over a once per mark spaced equalizer. First, the noise characteristics are better and second, the FSE is able to correct for timing offsets. In addition, by training on a specific sequence at the beginning of a data block, the FSE filter can adapt to differences in individual recorders and players that read and write marks, enviromental changes, and also to individual disc/media variations. Also, the FSE filter can adapt to changes that occur over time as an individual player experiences wear. In another embodiment, the FSE, possibly together with the precompensation, undoes the intersymbol interference in the data signal. This is referred to as a zero forcing equalizer. A FSE is described further in Proakis, "Digital Communications," 3rd edition, which is herein incorporated by reference, at pp. 617–620, and also in Lee & Messerschmitt, "Digital Communication," 2nd ed., which is herein incorporated by reference at pp.482,484,544.

Referring back to FIG. 2, the signal output from the FSE is interpreted by a Viterbi detector 234. The Viterbi detector interprets the signal levels and determines the most likely sequence of data based on a metric. It calculates this metric for all combinations of paths and, after some time, chooses the path that was most likely as determined by the path-metric calculation.

The Viterbi detector includes a mark handler that removes the effect of non data marks on the equalized signal output from the FSE. In one embodiment, the Viterbi accomplishes this by periodically ignoring marks in the locations where nondata marks are known to exist.

The output signal from the Viterbi is sent to an error correction code (ECC) decoder 236. The ECC decoder decodes the data and checks for errors in the data. One such error correction code used in one embodiment is described in U.S. patent application Ser. No. 09/083,699 entitled, Method And Apparatus For Modulation Encoding Data For Storage On A Multi-Level Optical Recording Medium by Welch, et. al which is herein incorporated by reference.

A system for reading multilevel marks including automatic gain control fields and decoding data from those marks has been described. Next, the marks themselves and a system for writing such marks is described. A typical mark pattern generated by such a writing system and read by the read system described above is shown.

In one embodiment, the system disclosed is used to read and write data marks to a disc where each of the data marks are the same length. Constraints are not imposed that require a minimum number of identical data marks to be written consecutively or that define a maximum number of identical data marks that may be placed next to each other. Neither are constraints imposed that require the data marks to periodically return to a certain level, as with a return to zero code. In other embodiments, run length limited codes or return to zero codes may be used. In addition to data marks, system marks are also included periodically in the data stream to facilitate the operation of the modules described above. Sets of marks that together perform a function are referred to as a field. System marks may include timing, AGC, and DC control marks that are periodically inserted into the data stream. Some system markes may also be used for multiple purposes.

Figure 5A:
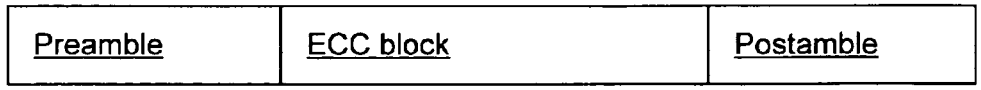
FIG. 5A is a block diagram showing a data block format used in one embodiment.
Figure 5B:
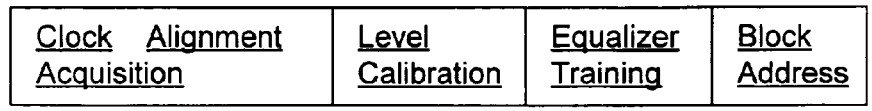
FIG. 5B illustrates a preamble sequence.

FIG. 5A is a block diagram showing a data block format used in one embodiment. The preamble (which is described further in FIG. 5B) contains sections for clock acquisition, level calibration, equalizer training, alignment, block address, and, in some embodiments, may also contain a start of data pattern. The clock acquisition section contains timing and AGC fields with no data in between them so that amplitude modulation can be removed and the clock can be acquired. The level calibration pattern contains long signals at each level to calibrate the system. The alignment sequence is a pseudo random sequence that has a response such that when the alignment sequence is correlated with itself, the correlation has a sharp peak; that is the correlation has a substantially high value at only a location that indicates precise alignment. The equalizer training sequence enables the adjustment of the equalizer to the particular disc and player combination being read. The block address enables the system to uniquely identify the ECC block on the disc. In some embodiments, a start of data pattern sequence identifies the start of the data pattern. In other embodiments, the start of the data pattern is determined by an offset from the alignment block.

Figure 5C:
FIG. 5C illustrates an ECC block

The ECC block includes modulation encoded marks and physical format marks. The modulation encoded marks are encoded by the modulation so that their form is altered by the modulation code and the physical format marks are periodically inserted in the data stream after modulation coding so that their form is not altered by the modulation coding. The ECC block (which is shown in FIG. 5C) contains an encoded address section, periodic ECC-data synch fields, periodic timing fields, periodic AGC fields, periodic DC control fields, encoded data marks, encoded ECC marks, and encoded trellis clean-up marks. The physical format ECC block marks include periodic ECC-data synch fields, periodic timing fields, periodic AGC fields, and periodic DC control fields. The physical format marks plus the modulation encoded marks comprise the ECC block.

The data marks (g) are interspersed between the other format marks or fields (groups of marks). The address section (a) duplicates the address of the ECC block and also contains an error detection code. The ECC-data synch (b) fields provide location information within the ECC block to aid data recovery. As described above, the timing fields (c) are used to recover the clock, and the AGC (d) fields are used to remove the low-frequency drift in the envelope. The DC control (e) fields are used to control the DC content of the signal. The ECC (f) fields contain the error correction bytes that enable locating and correcting errors in the data stream. Finally, the encoded trellis clean-up marks (h) are used to return the trellis coded marks to a known state at periodic points in the ECC block.

Figure 5D:
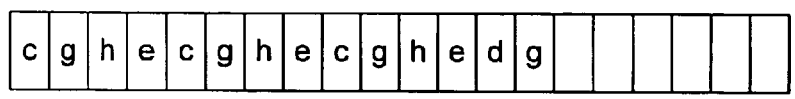
FIG. 5D illustrates a postamble sequence.

FIG. 5D illustrates a postamble sequence. The sequence includes timing fields (c), AGC fields (d), filler data marks (g), and DC control fields (e). DC control fields are used to reduce the output DC level of the data block structure. In some embodiments, the postamble may also contain encoded trellis clean-up marks (h) to leave the trellis in a known state.

FIG. 6 is a block diagram illustrating a system for writing multilevel marks to a disc. Data from a data buffer 600 is input to an ECC encoding block 601 where ECC check bytes are added to the data stream. In another embodiment, the data may first be scrambled in a predictable way prior to ECC encoding. This can be accomplished with a feed-back shift register or other suitable means. In other embodiments, the data may be scrambled after ECC encoding. This data is then fed to a multilevel modulation block 602. Multilevel modulation block 602 includes a convolution coding block 604 and a mark block 605 that adds the ECC-data synch fields, the DC control fields, and run length limited (RLL) constraints, if such constraints are implemented. Timing and automatic gain control fields such as are described above are added in a block 606. The data stream is then sent to a precompensator 608 and the output of the precompensator is sent to a multilevel implementer 610 that translates the data stream into a bit stream in accordance with the laser write strategy selected for the disc being recorded.

In this embodiment, the ECC encoded data is convolutionally encoded. Convolutional encoding adds correlations between data marks. Both these correlations and correlations due to the optical channel's inherent intersymbol interference can enable more accurate decoding of the data sequence by a maximum likelihood detector, such as a Viterbi detector. In one embodiment, in order to achieve a data rate of 3 bits/mark with M=12 levels, the modulation is 2-dimensional such that 6 bits plus 1 parity bit are encoded into a symbol consisting of two adjacent marks. Since 7 bits require 128 symbols, 16 of the possible 12×12=144 symbols are not be used. The 128-cross modulation constellation is given below in Table 1. The symbol assignment is found by taking first the row and then the column number for the value to be encoded. For example, the 7-bit value 64 would be encoded as two marks of levels 4 and 7. 999 indicates an invalid symbol.

TABLE 1

| | | | | | | | | | | | | |
|---|---|---|---|---|---|---|---|---|---|---|---|---|
| 11 | 999 | 999 | 20 | 97 | 16 | 101 | 100 | 17 | 96 | 21 | 999 | 999 |
| 10 | 999 | 999 | 107 | 110 | 31 | 26 | 27 | 30 | 111 | 106 | 999 | 999 |
| 9 | 12 | 41 | 8 | 45 | 92 | 89 | 88 | 93 | 44 | 9 | 40 | 13 |
| 8 | 35 | 38 | 87 | 2 | 83 | 6 | 7 | 82 | 3 | 86 | 39 | 34 |
| 7 | 48 | 53 | 68 | 113 | 64 | 117 | 117 | 65 | 112 | 69 | 52 | 49 |
| 6 | 127 | 58 | 123 | 62 | 79 | 74 | 75 | 78 | 63 | 122 | 59 | 126 |
| 5 | 124 | 57 | 120 | 61 | 76 | 73 | 72 | 77 | 60 | 121 | 56 | 125 |
| 4 | 51 | 54 | 71 | 114 | 67 | 118 | 119 | 66 | 115 | 70 | 55 | 50 |
| 3 | 32 | 37 | 84 | 1 | 80 | 5 | 4 | 81 | 0 | 85 | 36 | 33 |
| 2 | 15 | 42 | 11 | 46 | 95 | 90 | 91 | 94 | 47 | 10 | 43 | 14 |
| 1 | 999 | 999 | 104 | 109 | 28 | 25 | 24 | 29 | 108 | 105 | 999 | 999 |
| 0 | 999 | 999 | 23 | 98 | 19 | 102 | 103 | 18 | 99 | 22 | 999 | 999 |
| 2nd | 0 | 1 | 2 | 3 | 4 | 5 | 6 | 7 | 8 | 9 | 10 | 11 |
| 1st | | | | | | | | | | | | |

The convolutional encoding is chosen from Table III of "Trellis-Coded Modulation with Redundant Signal Sets, Part 1," Gottfried Ungerboeck, IEEE Communications Magazine, February 1987. The choice is made to balance complexity against coding gain.

Mark Block 605 adds the ECC-data synch patterns which are composed of symbols chosen from the 16 symbols not found in the modulation constellation. One embodiment is given below in Table 2.

TABLE 2

| Sync0  | 0  | 11 | 11 | 0  | 0  | 11 | 11 | 0  | 0  | 11 |
|--------|----|----|----|----|----|----|----|----|----|----|
| Sync1  | 11 | 0  | 0  | 11 | 11 | 0  | 0  | 11 | 11 | 0  |
| Sync2  | 1  | 10 | 10 | 1  | 1  | 10 | 10 | 1  | 1  | 10 |
| Sync3  | 10 | 1  | 1  | 10 | 10 | 1  | 1  | 10 | 10 | 1  |
| Sync4  | 10 | 10 | 1  | 1  | 10 | 1  | 11 | 11 | 0  | 0  |
| Sync5  | 0  | 0  | 11 | 11 | 1  | 10 | 1  | 1  | 10 | 10 |
| Sync6  | 11 | 11 | 0  | 0  | 10 | 1  | 10 | 10 | 1  | 1  |
| Sync7  | 1  | 1  | 10 | 10 | 1  | 10 | 0  | 0  | 11 | 11 |
| Sync8  | 0  | 1  | 11 | 10 | 1  | 0  | 1  | 11 | 10 | 10 |
| Sync9  | 11 | 0  | 11 | 0  | 11 | 0  | 11 | 0  | 11 | 0  |
| Sync10 | 11 | 10 | 0  | 0  | 1  | 10 | 10 | 1  | 11 | 1  |
| Sync11 | 10 | 1  | 10 | 1  | 10 | 1  | 10 | 1  | 10 | 1  |
| Sync12 | 1  | 10 | 11 | 11 | 0  | 0  | 1  | 10 | 11 | 0  |

Next the DC control fields are added. The DC content of the data signal can be measured using a running digital sum (RDS). In a 12-level system, the each level is assigned a DC content value. For example, level 0, 1, 2, 3, 4, 5, 6, 7, 8, 9, 10, 11 are assigned DC content values $-11, -9, -7, -5, -3, -1, 1, 3, 5, 7, 9, 11$ respectively. RDS is the running sum of the DC content values as the data levels are read. By maintaining the RDS near zero, the average data signal level is near center of the amplitude range of the signal. In one embodiment, the DC control fields signify the inversion or not of the data that is found after one DC control field until the next DC control field or timing pattern. For the 12-level modulation code above, inversion would mean that the data mark level k would become data mark level 11-k. In other words, a level 11 would become 0 and a level 3 would become 8. The inversion helps to control the DC content of the data stream. RLL marks can end runs of data at the same level by inserting a mark of a different level at particular locations in the data stream. In one embodiment, the timing, AGC, and DC control fields are frequent enough to act as RLL marks. In other embodiments, separate RLL marks may need to be added.

The marks are then sent on to the precompensator which adjusts the levels desired taking into account the neighboring marks to remove the effects of intersymbol interference or else cause a certain intersymbol interference target to be realized.

If the intersymbol interference is precompensated to a specific target intersymbol interference, the intersymbol interference can be used by the Viterbi detector to better decode the data. The intersymbol interference adds correlations into the data stream so that maximum likelihood detection, as is done when using a Viterbi detector, can better interpret the data signal. Correlations can also be introduced into the data stream explicitly using a convolutional code. In various embodiments, correlations are introduced using several different methods or combinations of such methods. For example, correlations may be introduced by the optical system, can be shaped by using precompensation, can be introduced using a convolutional code, and can be introduced by both ISI and convolutional encoding.

In addition, in certain embodiments, write calibration is included with the multilevel implementer. Write calibration compensates for changes in the writing of marks on the disc due to age or wear as well as variations in disc characteristics. The write calibration procedure has 3 iterative steps: 1) write a known pattern to the disc, 2) read the pattern, 3) adjust the write strategy to ensure that the pattern written causes the pattern that is read to be the desired read pattern. In one embodiment, the read pattern is compared to a linear filtered version of the written pattern. In this embodiment, the adjustments are made so that the non-linear effects of the system are removed or compensated for by calibration. In other embodiments, both the linear and the non-linear effects of the read and write system can be calibrated or compensated for using this method.

This procedure allows the player and disc combination to adjust for changes that may affect the writing and reading of data onto the disc. Factors that might be calibrated out using this procedure include laser age, laser temperature, dust on the lens or disc, and variation of the disc materials.

Finally, the adjusted levels are sent to the multi-level implementer which translates the levels determined using the precompensator and the write calibrator to a series of pulses of specific laser powers of specific durations at specific times.

FIG. 7 shows an arrangement for information storage suitable for a 120 mm optical disc. The disc has three main areas: lead-in area (LIA) 705, data area (DA) 710, and lead-out area (LOA) 715. This figure shows the layout of a spiral track represented as one line. The lead-in area is reserved for system and media information. The data area contains about 2 Gigabytes. The lead-out area is also reserved for system and media information. In this embodiment there are 1024 physical information blocks in the LIA. The DA contains user information in 61036 physical information blocks. The LOA is reserved for system and media information and occupies 523 physical information blocks. Table 3 contains information regarding the physical format of this disc.

TABLE 3

| Inner radius     | 22.5 mm            |
|------------------|--------------------|
| Outer radius     | 59.0 mm            |
| Track pitch      | 1.6 m              |
| Data cell length | 0.6 m              |
| Total data cells | $9.73 \times 10^9$ |

Figure 8:
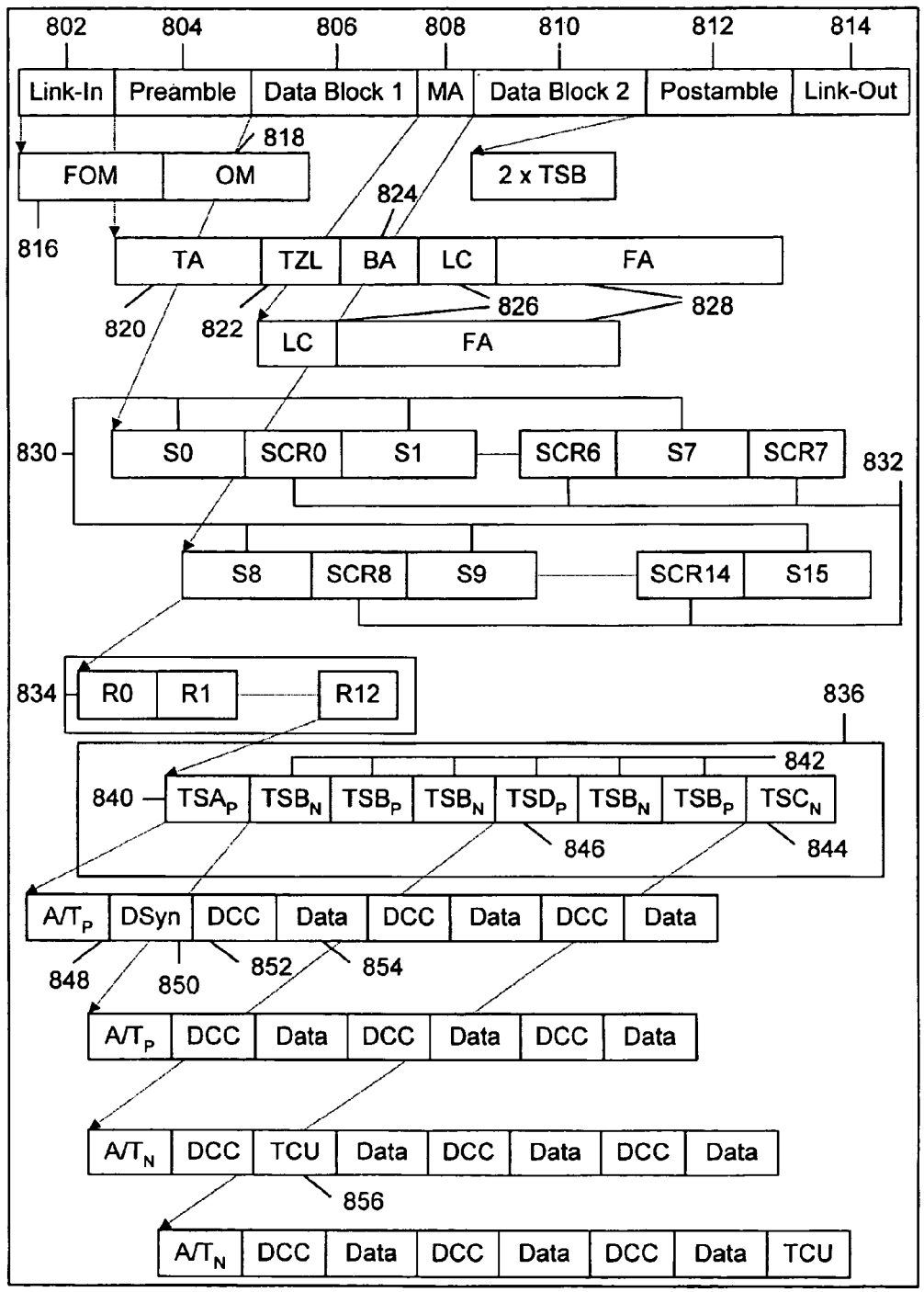
FIG. 8 is a diagram of an information block.

Referring to FIG. 8, there is depicted the format for the physical information blocks. The physical information block is made up of link-in 802, preamble 804, data block 1 806, data block 2 810, midamble (MA) 808, postamble 812, and link-out 814. The link areas are neutral areas to ensure that blocks do not overwrite each other. The preamble and postamble are in preparation for and cleaning up after reading a data block. In one embodiment, a block of data organized into sixteen sectors, each of which contains thirteen rows, is placed in data block 1 and data block 2 such that data block 1 and data block 2 each contain eight sectors. The link-in region is made up of a fractional oscillating mid-level pattern area (FOM) 816 for dithering the timing marks and a fixed oscillating mid-level pattern area (OM) 818. The size of the link-in is FOM+OM=695+round(a*87) where a is a random fraction between 0 and 1 (and rounded to the nearest integer mark). The pattern for the FOM and OM areas oscillates between levels 3 and 4 for an 8-level system (levels 0–7). No marks are written during the link-out. The link-out is only a place holder of length 607-round (a*87), where a is the same fraction as is used in the link-in.

In FIG. 8 the preamble 804 is composed of structures that make each block a stand-alone decodable unit. The block has a timing acquisition area, address area, and areas to adapt to the different channel characteristics. Specifically, the preamble contains the following areas: timing acquisition (TA) 820, time zero locator (TZL) 822, block address (BA) 824, level calibration (LC) 826, and fractionally spaced equalizer adaptation sequence (FA) 828. The total length of the preamble is 2695 marks. The 816 mark timing acquisition (TA) area contains the pattern {0 0 0 7 7 7} repeated 136 times, which allows the PLL to lock-up quickly. The time zero locator (TZL) pattern is made up of sequences of {0 0 0} and {7 7 7}. The TZL was chosen so that the pattern of transitions and lack of transitions between each group of three marks (represented by a 1 and 0 respectively) makes up a 31 bit M-sequence. The pattern of missing transitions allows the synch detector to recognize the end of the high-gain timing acquisition region and allows the PLL to switch to the tracking mode. The TZL ends with eight repetitions of {0 0 0 0 0 7 7 7 7 7} to help initialize the digital desnaker. The TZL sequence has a well behaved auto-correlation property. This property of the TZL or alignment sequence is used to precisely locate the beginning of a data block marked by an adjacent TZL sequence. The TZL sequence is shown in Table 4.

TABLE 4

| Position | TZL |
|---|---|
| 1 | 7 |
| 2 | 7 |
| 3 | 7 |
| 4 | 7 |
| 5 | 7 |
| 6 | 7 |
| 7 | 0 |
| 8 | 0 |
| 9 | 0 |
| 10 | 7 |
| 11 | 7 |
| 12 | 7 |
| 13 | 7 |
| 14 | 7 |
| 15 | 7 |
| 16 | 0 |
| 17 | 0 |
| 18 | 0 |
| 19 | 7 |
| 20 | 7 |
| 21 | 7 |
| 22 | 0 |
| 23 | 0 |
| 24 | 0 |
| 25 | 0 |
| 26 | 0 |
| 27 | 0 |
| 28 | 7 |
| 29 | 7 |
| 30 | 7 |
| 31 | 7 |
| 32 | 7 |
| 33 | 7 |
| 34 | 0 |
| 35 | 0 |
| 36 | 0 |
| 37 | 0 |
| 38 | 0 |
| 39 | 0 |
| 40 | 0 |
| 41 | 0 |
| 42 | 0 |
| 43 | 0 |
| 44 | 0 |
| 45 | 0 |
| 46 | 0 |
| 47 | 0 |
| 48 | 0 |
| 49 | 7 |
| 50 | 7 |
| 51 | 7 |
| 52 | 7 |
| 53 | 7 |
| 54 | 7 |
| 55 | 7 |
| 56 | 7 |
| 57 | 7 |
| 58 | 0 |
| 59 | 0 |
| 60 | 0 |
| 61 | 0 |
| 62 | 0 |
| 63 | 0 |
| 64 | 7 |
| 65 | 7 |
| 66 | 7 |
| 67 | 0 |
| 68 | 0 |
| 69 | 0 |
| 70 | 0 |
| 71 | 0 |
| 72 | 0 |
| 73 | 0 |
| 74 | 0 |
| 75 | 0 |
| 76 | 7 |
| 77 | 7 |
| 78 | 7 |
| 79 | 0 |
| 80 | 0 |
| 81 | 0 |
| 82 | 7 |
| 83 | 7 |
| 84 | 7 |
| 85 | 0 |
| 86 | 0 |
| 87 | 0 |
| 88 | 7 |
| 89 | 7 |
| 90 | 7 |
| 91 | 7 |
| 92 | 7 |
| 93 | 7 |
| 94 | 7 |
| 95 | 7 |
| 96 | 7 |
| 97 | 0 |
| 98 | 0 |
| 99 | 0 |
| 100 | 7 |
| 101 | 7 |
| 102 | 7 |
| 103 | 0 |
| 104 | 0 |
| 105 | 0 |
| 106 | 7 |
| 107 | 7 |
| 108 | 7 |
| 109 | 0 |
| 110 | 0 |
| 111 | 0 |
| 112 | 7 |
| 113 | 7 |
| 114 | 7 |
| 115 | 0 |
| 116 | 0 |
| 117 | 0 |
| 118 | 7 |
| 119 | 7 |
| 120 | 7 |
| 121 | 0 |
| 122 | 0 |
| 123 | 0 |
| 124 | 7 |
| 125 | 7 |
| 126 | 7 |
| 127 | 0 |
| 128 | 0 |
| 129 | 0 |
| 130 | 7 |
| 131 | 7 |
| 132 | 7 |
| 133 | 0 |
| 134 | 0 |

TABLE 4-continued

| Position | TZL |
|---|---|
| 135 | 0 |
| 136 | 7 |
| 137 | 7 |
| 138 | 7 |
| 139 | 0 |
| 140 | 0 |
| 141 | 0 |
| 142 | 7 |
| 143 | 7 |
| 144 | 7 |
| 145 | 0 |
| 146 | 0 |
| 147 | 0 |
| 148 | 0 |
| 149 | 0 |
| 150 | 7 |
| 151 | 7 |
| 152 | 7 |
| 153 | 7 |
| 154 | 7 |
| 155 | 0 |
| 156 | 0 |
| 157 | 0 |
| 158 | 0 |
| 159 | 0 |
| 160 | 7 |
| 161 | 7 |
| 162 | 7 |
| 163 | 7 |
| 164 | 7 |
| 165 | 0 |
| 166 | 0 |
| 167 | 0 |
| 168 | 0 |
| 169 | 0 |
| 170 | 7 |
| 171 | 7 |
| 172 | 7 |
| 173 | 7 |
| 174 | 7 |
| 175 | 0 |
| 176 | 0 |
| 177 | 0 |
| 178 | 0 |
| 179 | 0 |
| 180 | 7 |
| 181 | 7 |
| 182 | 7 |
| 183 | 7 |
| 184 | 7 |
| 185 | 0 |
| 186 | 0 |
| 187 | 0 |
| 188 | 0 |
| 189 | 0 |
| 190 | 7 |
| 191 | 7 |
| 192 | 7 |
| 193 | 7 |
| 194 | 7 |
| 195 | 0 |
| 196 | 0 |
| 197 | 0 |
| 198 | 0 |
| 199 | 0 |
| 200 | 7 |
| 201 | 7 |
| 202 | 7 |
| 203 | 7 |
| 204 | 7 |
| 205 | 0 |
| 206 | 0 |
| 207 | 0 |
| 208 | 0 |
| 209 | 0 |
| 210 | 7 |
| 211 | 7 |
| 212 | 7 |
| 213 | 7 |
| 214 | 7 |
| 215 | 0 |
| 216 | 0 |
| 217 | 0 |
| 218 | 0 |
| 219 | 0 |
| 220 | 7 |
| 221 | 7 |
| 222 | 7 |
| 223 | 7 |
| 224 | 7 |
| 225 | 3 |
| 226 | 4 |

In FIG. 9, the block address (BA) 824 is shown in detail. The BA contains six bytes: three bytes of address 905, two bytes for error detection IED 910, and 1 Reserved byte 915. The address information in the BA consist of four bytes whose bits are numbered from $b_0$ (LSB) to $b_{31}$ (MSB). The least significant three bytes, bits $b_0$ to $b_{23}$ 905, specify the block number in binary notation. Each error detection codeword constitutes a matrix whose bytes are identified by $C_j$=0 to 5. The bytes of the IED are $C_4$ and $C_5$., and $$IED(x) = \sum_{j=4}^{5} C_j x^{5-j} = I(x) x^2 \bmod G_E(x)$$

where, $$I_x = \sum_{j=0}^{3} C_j x^{3-j}$$

$$G_E(x) = \prod_{k=0}^{1} (x + ^k)$$

is the primitive root of the primitive polynomial $P(x)=x^8+x^4+x^3+x^2+1$.

For increased error resilience and DC balance,of the BA 824, each bit is represented as two marks and the entire pattern is repeated. A Manchester encoding scheme is used whereby a 0 bit is represented by the marks {0 7}, and a 1 bit is represented by {7 0}. The address information bytes are encoded in 6 bytes*(8 bits/byte)*2 marks/bit=96 marks, which are repeated for a total of 192.

The placement of the encoded block address marks is shown is shown in FIG. 10. The address is encoded twice. Address information 1 and Address Information 2 1005 and Address Information A and Address Information B 1010 contain the encoded address. The three timing subunits OM1 1015, OM2 1020 and OM3 1025 are filled with oscillating midlevel marks of level 3 and 4. The OM sequence is given in Table 5. The $A/T_N$ 1030, $A/T_P$ 1035, and $A/T_N$ 1040 provide marks for Automatic Gain Control/Timing Field (A/T). The pattern for the A/T fields is {0 0 0 0 0 7 7 7 7 7} for a positive edge ($A/T_P$) and {7 7 7 7 7 0 0 0 0 0} for a negative edge ($A/T_P$) in the 8-level system (levels 0-7).

TABLE 5

| Position | OM BA |
|---|---|
| 1 | 4 |
| 2 | 3 |
| 3 | 4 |
| 4 | 3 |
| 5 | 4 |
| 6 | 3 |
| 7 | 4 |
| 8 | 3 |
| 9 | 4 |
| 10 | 3 |
| 11 | 4 |
| 12 | 3 |
| 13 | 4 |
| 14 | 3 |
| 15 | 4 |
| 16 | 3 |
| 17 | 4 |
| 18 | 3 |
| 19 | 4 |
| 20 | 3 |
| 21 | 4 |
| 22 | 3 |
| 23 | 4 |
| 24 | 3 |
| 25 | 4 |
| 26 | 3 |
| 27 | 4 |
| 28 | 3 |
| 29 | 4 |
| 30 | 3 |
| 31 | 4 |
| 32 | 3 |
| 33 | 4 |
| 34 | 3 |
| 35 | 4 |
| 36 | 3 |
| 37 | 4 |
| 38 | 3 |
| 39 | 4 |

The level calibration sequence (LC) 826 is designed to provide level information that is not affected by intersymbol interference. The 4 LC subunits are listed below:
$AT_P$,LC1 (positions 1–77),
$AT_N$,LC2 (positions 78–154),
$AT_P$,LC3 (positions 155–231),
$AT_N$,LC4 (positions 232–308),
where A/T are positive going AGC/Timing field and LC1–LC4 are given in Table 6.

TABLE 6

| Position | LC 1 | Position | LC 2 | Position | LC 3 | Position | LC 4 |
|---|---|---|---|---|---|---|---|
| 1 | 7 | 78 | 0 | 155 | 7 | 232 | 0 |
| 2 | 4 | 79 | 5 | 156 | 4 | 233 | 5 |
| 3 | 4 | 80 | 5 | 157 | 4 | 234 | 5 |
| 4 | 4 | 81 | 5 | 158 | 4 | 235 | 5 |
| 5 | 4 | 82 | 5 | 159 | 4 | 236 | 5 |
| 6 | 4 | 83 | 5 | 160 | 4 | 237 | 5 |
| 7 | 1 | 84 | 2 | 161 | 1 | 238 | 2 |
| 8 | 1 | 85 | 2 | 162 | 1 | 239 | 2 |
| 9 | 1 | 86 | 2 | 163 | 1 | 240 | 2 |
| 10 | 1 | 87 | 2 | 164 | 1 | 241 | 2 |
| 11 | 1 | 88 | 2 | 165 | 1 | 242 | 2 |
| 12 | 6 | 89 | 7 | 166 | 6 | 243 | 7 |
| 13 | 6 | 90 | 7 | 167 | 6 | 244 | 7 |
| 14 | 6 | 91 | 7 | 168 | 6 | 245 | 7 |
| 15 | 6 | 92 | 7 | 169 | 6 | 246 | 7 |
| 16 | 6 | 93 | 7 | 170 | 6 | 247 | 7 |
| 17 | 3 | 94 | 4 | 171 | 3 | 248 | 4 |
| 18 | 3 | 95 | 4 | 172 | 3 | 249 | 4 |
| 19 | 3 | 96 | 4 | 173 | 3 | 250 | 4 |
| 20 | 3 | 97 | 4 | 174 | 3 | 251 | 4 |
| 21 | 3 | 98 | 4 | 175 | 3 | 252 | 4 |
| 22 | 0 | 99 | 1 | 176 | 0 | 253 | 1 |
| 23 | 0 | 100 | 1 | 177 | 0 | 254 | 1 |
| 24 | 0 | 101 | 1 | 178 | 0 | 255 | 1 |
| 25 | 0 | 102 | 1 | 179 | 0 | 256 | 1 |
| 26 | 0 | 103 | 1 | 180 | 0 | 257 | 1 |
| 27 | 5 | 104 | 6 | 181 | 5 | 258 | 6 |
| 28 | 5 | 105 | 6 | 182 | 5 | 259 | 6 |
| 29 | 5 | 106 | 6 | 183 | 5 | 260 | 6 |
| 30 | 5 | 107 | 6 | 184 | 5 | 261 | 6 |
| 31 | 5 | 108 | 6 | 185 | 5 | 262 | 6 |
| 32 | 2 | 109 | 3 | 186 | 2 | 263 | 3 |
| 33 | 2 | 110 | 3 | 187 | 2 | 264 | 3 |
| 34 | 2 | 111 | 3 | 188 | 2 | 265 | 3 |
| 35 | 2 | 112 | 3 | 189 | 2 | 266 | 3 |
| 36 | 2 | 113 | 3 | 190 | 2 | 267 | 3 |
| 37 | 7 | 114 | 0 | 191 | 7 | 268 | 0 |
| 38 | 7 | 115 | 0 | 192 | 7 | 269 | 0 |
| 39 | 7 | 116 | 0 | 193 | 7 | 270 | 0 |
| 40 | 7 | 117 | 0 | 194 | 7 | 271 | 0 |
| 41 | 7 | 118 | 0 | 195 | 7 | 272 | 0 |
| 42 | 4 | 119 | 5 | 196 | 4 | 273 | 5 |
| 43 | 4 | 120 | 5 | 197 | 4 | 274 | 5 |
| 44 | 4 | 121 | 5 | 198 | 4 | 275 | 5 |
| 45 | 4 | 122 | 5 | 199 | 4 | 276 | 5 |
| 46 | 4 | 123 | 5 | 200 | 4 | 277 | 5 |
| 47 | 1 | 124 | 2 | 201 | 1 | 278 | 2 |
| 48 | 1 | 125 | 2 | 202 | 1 | 279 | 2 |
| 49 | 1 | 126 | 2 | 203 | 1 | 280 | 2 |
| 50 | 1 | 127 | 2 | 204 | 1 | 281 | 2 |
| 51 | 1 | 128 | 2 | 205 | 1 | 282 | 2 |
| 52 | 6 | 129 | 7 | 206 | 6 | 283 | 7 |
| 53 | 6 | 130 | 7 | 207 | 6 | 284 | 7 |
| 54 | 6 | 131 | 7 | 208 | 6 | 285 | 7 |
| 55 | 6 | 132 | 7 | 209 | 6 | 286 | 7 |
| 56 | 6 | 133 | 7 | 210 | 6 | 287 | 7 |
| 57 | 3 | 134 | 4 | 211 | 3 | 288 | 4 |
| 58 | 3 | 135 | 4 | 212 | 3 | 289 | 4 |
| 59 | 3 | 136 | 4 | 213 | 3 | 290 | 4 |
| 60 | 3 | 137 | 4 | 214 | 3 | 291 | 4 |
| 61 | 3 | 138 | 4 | 215 | 3 | 292 | 4 |
| 62 | 0 | 139 | 1 | 216 | 0 | 293 | 1 |
| 63 | 0 | 140 | 1 | 217 | 0 | 294 | 1 |
| 64 | 0 | 141 | 1 | 218 | 0 | 295 | 1 |
| 65 | 0 | 142 | 1 | 219 | 0 | 296 | 1 |
| 66 | 0 | 143 | 1 | 220 | 0 | 297 | 1 |
| 67 | 5 | 144 | 6 | 221 | 5 | 298 | 6 |
| 68 | 5 | 145 | 6 | 222 | 5 | 299 | 6 |
| 69 | 5 | 146 | 6 | 223 | 5 | 300 | 6 |
| 70 | 5 | 147 | 6 | 224 | 5 | 301 | 6 |
| 71 | 5 | 148 | 6 | 225 | 5 | 302 | 6 |
| 72 | 2 | 149 | 3 | 226 | 2 | 303 | 3 |
| 73 | 2 | 150 | 3 | 227 | 2 | 304 | 3 |
| 74 | 2 | 151 | 3 | 228 | 2 | 305 | 3 |
| 75 | 2 | 152 | 3 | 229 | 2 | 306 | 3 |
| 76 | 2 | 153 | 3 | 230 | 2 | 307 | 3 |
| 77 | 7 | 154 | 0 | 231 | 7 | 308 | 0 |

The fractionally spaced equalizer training sequence (FA) 828 is designed to provide level information that is broadband and DC free to train the equalizer taps. The 12 FA timing subunits are listed below:
$A/T_P$, FA 1 (positions 1–77),
$A/T_N$, FA 2 (positions 78–154),
$A/T_P$, FA 3 (positions 155–231),
$A/T_N$, FA 4 (positions 232–308),
$A/T_P$, FA 5 (positions 309–385),
$A/T_N$, FA 6 (positions 386–462),
$A/T_P$, FA 7 (positions 463–539),
$A/T_N$, FA 8 (positions 540–616),
$A/T_P$, FA 9 (positions 617–693),
$A/T_N$, FA 10 (positions 694–770), A/T$_P$, FA 11 (positions 771–847),
A/T$_N$, FA 12 (positions 848–924),
where A/T are a positive/negative going AGC/Timing field and FA 1–FA 12 are given in the tables 7A, 7B and 7C.

TABLE 7A

| Position | FA1 | Position | FA2 | Position | FA3 | Position | FA4 |
|---|---|---|---|---|---|---|---|
| 1 | 3 | 78 | 2 | 155 | 0 | 232 | 7 |
| 2 | 7 | 79 | 5 | 156 | 5 | 233 | 2 |
| 3 | 1 | 80 | 2 | 157 | 7 | 234 | 2 |
| 4 | 3 | 81 | 7 | 158 | 1 | 235 | 6 |
| 5 | 6 | 82 | 1 | 159 | 5 | 236 | 1 |
| 6 | 2 | 83 | 3 | 160 | 0 | 237 | 1 |
| 7 | 1 | 84 | 4 | 161 | 6 | 238 | 4 |
| 8 | 7 | 85 | 1 | 162 | 2 | 239 | 6 |
| 9 | 2 | 86 | 4 | 163 | 5 | 240 | 0 |
| 10 | 1 | 87 | 7 | 164 | 2 | 241 | 7 |
| 11 | 7 | 88 | 0 | 165 | 7 | 242 | 3 |
| 12 | 3 | 89 | 5 | 166 | 1 | 243 | 5 |
| 13 | 2 | 90 | 7 | 167 | 4 | 244 | 3 |
| 14 | 7 | 91 | 2 | 168 | 2 | 245 | 3 |
| 15 | 3 | 92 | 2 | 169 | 5 | 246 | 2 |
| 16 | 1 | 93 | 7 | 170 | 0 | 247 | 6 |
| 17 | 2 | 94 | 3 | 171 | 5 | 248 | 1 |
| 18 | 7 | 95 | 2 | 172 | 5 | 249 | 5 |
| 19 | 2 | 96 | 0 | 173 | 3 | 250 | 1 |
| 20 | 3 | 97 | 7 | 174 | 4 | 251 | 7 |
| 21 | 5 | 98 | 1 | 175 | 3 | 252 | 0 |
| 22 | 3 | 99 | 4 | 176 | 4 | 253 | 6 |
| 23 | 3 | 100 | 4 | 177 | 5 | 254 | 1 |
| 24 | 0 | 101 | 1 | 178 | 1 | 255 | 4 |
| 25 | 6 | 102 | 4 | 179 | 4 | 256 | 7 |
| 26 | 4 | 103 | 5 | 180 | 6 | 257 | 3 |
| 27 | 2 | 104 | 6 | 181 | 1 | 258 | 2 |
| 28 | 5 | 105 | 0 | 182 | 5 | 259 | 6 |
| 29 | 2 | 106 | 7 | 183 | 3 | 260 | 3 |
| 30 | 4 | 107 | 1 | 184 | 1 | 261 | 2 |
| 31 | 7 | 108 | 4 | 185 | 4 | 262 | 1 |
| 32 | 3 | 109 | 7 | 186 | 5 | 263 | 6 |
| 33 | 1 | 110 | 3 | 187 | 3 | 264 | 1 |
| 34 | 5 | 111 | 2 | 188 | 5 | 265 | 7 |
| 35 | 3 | 112 | 1 | 189 | 0 | 266 | 1 |
| 36 | 0 | 113 | 5 | 190 | 6 | 267 | 5 |
| 37 | 6 | 114 | 1 | 191 | 4 | 268 | 2 |
| 38 | 5 | 115 | 7 | 192 | 2 | 269 | 7 |
| 39 | 0 | 116 | 1 | 193 | 4 | 270 | 0 |
| 40 | 7 | 117 | 5 | 194 | 5 | 271 | 7 |
| 41 | 3 | 118 | 1 | 195 | 0 | 272 | 0 |
| 42 | 3 | 119 | 5 | 196 | 5 | 273 | 5 |
| 43 | 4 | 120 | 6 | 197 | 6 | 274 | 3 |
| 44 | 0 | 121 | 0 | 198 | 0 | 275 | 5 |
| 45 | 7 | 122 | 5 | 199 | 7 | 276 | 3 |
| 46 | 1 | 123 | 2 | 200 | 2 | 277 | 1 |
| 47 | 6 | 124 | 4 | 201 | 4 | 278 | 7 |
| 48 | 0 | 125 | 4 | 202 | 1 | 279 | 0 |
| 49 | 4 | 126 | 7 | 203 | 7 | 280 | 5 |
| 50 | 4 | 127 | 1 | 204 | 2 | 281 | 2 |
| 51 | 4 | 128 | 0 | 205 | 5 | 282 | 7 |
| 52 | 7 | 129 | 5 | 206 | 3 | 283 | 1 |
| 53 | 2 | 130 | 5 | 207 | 0 | 284 | 5 |
| 54 | 3 | 131 | 4 | 208 | 7 | 285 | 2 |
| 55 | 3 | 132 | 0 | 209 | 3 | 286 | 6 |
| 56 | 7 | 133 | 6 | 210 | 0 | 287 | 3 |
| 57 | 1 | 134 | 7 | 211 | 7 | 288 | 2 |
| 58 | 2 | 135 | 2 | 212 | 0 | 289 | 1 |
| 59 | 5 | 136 | 3 | 213 | 6 | 290 | 6 |
| 60 | 1 | 137 | 3 | 214 | 6 | 291 | 7 |
| 61 | 6 | 138 | 0 | 215 | 1 | 292 | 1 |
| 62 | 0 | 139 | 4 | 216 | 6 | 293 | 0 |
| 63 | 5 | 140 | 5 | 217 | 1 | 294 | 7 |
| 64 | 6 | 141 | 4 | 218 | 7 | 295 | 2 |
| 65 | 2 | 142 | 7 | 219 | 2 | 296 | 7 |
| 66 | 6 | 143 | 1 | 220 | 0 | 297 | 0 |
| 67 | 3 | 144 | 0 | 221 | 6 | 298 | 5 |
| 68 | 3 | 145 | 4 | 222 | 0 | 299 | 2 |
| 69 | 3 | 146 | 4 | 223 | 4 | 300 | 4 |
| 70 | 3 | 147 | 5 | 224 | 5 | 301 | 2 |
| 71 | 1 | 148 | 6 | 225 | 4 | 302 | 5 |
| 72 | 5 | 149 | 0 | 226 | 5 | 303 | 2 |
| 73 | 5 | 150 | 6 | 227 | 3 | 304 | 5 |
| 74 | 1 | 151 | 2 | 228 | 1 | 305 | 0 |
| 75 | 6 | 152 | 6 | 229 | 7 | 306 | 6 |
| 76 | 1 | 153 | 0 | 230 | 3 | 307 | 4 |
| 77 | 6 | 154 | 6 | 231 | 2 | 308 | 5 |

TABLE 7B

| Position | FA5 | Position | FA6 | Position | FA7 | Position | FA8 |
|---|---|---|---|---|---|---|---|
| 309 | 3 | 386 | 1 | 463 | 1 | 540 | 2 |
| 310 | 0 | 387 | 6 | 464 | 6 | 541 | 2 |
| 311 | 7 | 388 | 3 | 465 | 6 | 542 | 2 |
| 312 | 1 | 389 | 4 | 466 | 3 | 543 | 7 |
| 313 | 7 | 390 | 1 | 467 | 2 | 544 | 0 |
| 314 | 0 | 391 | 7 | 468 | 2 | 545 | 7 |
| 315 | 7 | 392 | 0 | 469 | 7 | 546 | 1 |
| 316 | 1 | 393 | 5 | 470 | 3 | 547 | 7 |
| 317 | 4 | 394 | 5 | 471 | 1 | 548 | 3 |
| 318 | 4 | 395 | 3 | 472 | 5 | 549 | 3 |
| 319 | 3 | 396 | 3 | 473 | 2 | 550 | 2 |
| 320 | 5 | 397 | 2 | 474 | 4 | 551 | 2 |
| 321 | 3 | 398 | 7 | 475 | 4 | 552 | 5 |
| 322 | 1 | 399 | 1 | 476 | 3 | 553 | 2 |
| 323 | 5 | 400 | 5 | 477 | 5 | 554 | 5 |
| 324 | 6 | 401 | 0 | 478 | 1 | 555 | 2 |
| 325 | 3 | 402 | 4 | 479 | 6 | 556 | 4 |
| 326 | 3 | 403 | 6 | 480 | 1 | 557 | 2 |
| 327 | 2 | 404 | 0 | 481 | 7 | 558 | 7 |
| 328 | 7 | 405 | 7 | 482 | 1 | 559 | 3 |
| 329 | 2 | 406 | 3 | 483 | 3 | 560 | 2 |
| 330 | 0 | 407 | 1 | 484 | 4 | 561 | 4 |
| 331 | 7 | 408 | 7 | 485 | 2 | 562 | 2 |
| 332 | 2 | 409 | 3 | 486 | 5 | 563 | 6 |
| 333 | 5 | 410 | 1 | 487 | 0 | 564 | 1 |
| 334 | 3 | 411 | 4 | 488 | 7 | 565 | 6 |
| 335 | 0 | 412 | 7 | 489 | 3 | 566 | 0 |
| 336 | 7 | 413 | 1 | 490 | 7 | 567 | 5 |
| 337 | 1 | 414 | 4 | 491 | 2 | 568 | 6 |
| 338 | 4 | 415 | 0 | 492 | 2 | 569 | 3 |
| 339 | 7 | 416 | 5 | 493 | 0 | 570 | 2 |
| 340 | 0 | 417 | 4 | 494 | 5 | 571 | 7 |
| 341 | 6 | 418 | 4 | 495 | 7 | 572 | 3 |
| 342 | 2 | 419 | 6 | 496 | 1 | 573 | 1 |
| 343 | 7 | 420 | 2 | 497 | 7 | 574 | 3 |
| 344 | 3 | 421 | 1 | 498 | 3 | 575 | 5 |
| 345 | 2 | 422 | 5 | 499 | 3 | 576 | 2 |
| 346 | 3 | 423 | 4 | 500 | 2 | 577 | 5 |
| 347 | 2 | 424 | 5 | 501 | 4 | 578 | 2 |
| 348 | 5 | 425 | 2 | 502 | 3 | 579 | 7 |
| 349 | 3 | 426 | 5 | 503 | 5 | 580 | 2 |
| 350 | 2 | 427 | 3 | 504 | 1 | 581 | 2 |
| 351 | 5 | 428 | 1 | 505 | 4 | 582 | 2 |
| 352 | 1 | 429 | 7 | 506 | 4 | 583 | 6 |
| 353 | 7 | 430 | 2 | 507 | 2 | 584 | 0 |
| 354 | 3 | 431 | 0 | 508 | 4 | 585 | 6 |
| 355 | 2 | 432 | 6 | 509 | 6 | 586 | 3 |
| 356 | 7 | 433 | 6 | 510 | 2 | 587 | 3 |
| 357 | 2 | 434 | 3 | 511 | 1 | 588 | 6 |
| 358 | 3 | 435 | 1 | 512 | 4 | 589 | 1 |
| 359 | 2 | 436 | 4 | 513 | 4 | 590 | 5 |
| 360 | 6 | 437 | 5 | 514 | 5 | 591 | 3 |
| 361 | 3 | 438 | 2 | 515 | 6 | 592 | 2 |
| 362 | 2 | 439 | 7 | 516 | 3 | 593 | 5 |
| 363 | 6 | 440 | 1 | 517 | 0 | 594 | 1 |
| 364 | 1 | 441 | 4 | 518 | 6 | 595 | 7 |
| 365 | 3 | 442 | 0 | 519 | 0 | 596 | 3 |
| 366 | 4 | 443 | 6 | 520 | 5 | 597 | 0 |
| 367 | 1 | 444 | 6 | 521 | 7 | 598 | 5 |
| 368 | 4 | 445 | 3 | 522 | 1 | 599 | 7 |
| 369 | 4 | 446 | 1 | 523 | 5 | 600 | 1 |
| 370 | 6 | 447 | 5 | 524 | 2 | 601 | 6 |
| 371 | 0 | 448 | 2 | 525 | 1 | 602 | 0 |
| 372 | 5 | 449 | 7 | 526 | 4 | 603 | 7 |

TABLE 7B-continued

| | | | | | | | |
|---|---|---|---|---|---|---|---|
| 373 | 6 | 450 | 2 | 527 | 7 | 604 | 3 |
| 374 | 2 | 451 | 1 | 528 | 1 | 605 | 2 |
| 375 | 1 | 452 | 5 | 529 | 6 | 606 | 1 |
| 376 | 5 | 453 | 5 | 530 | 0 | 607 | 6 |
| 377 | 7 | 454 | 0 | 531 | 5 | 608 | 1 |
| 378 | 1 | 455 | 6 | 532 | 4 | 609 | 4 |
| 379 | 0 | 456 | 3 | 533 | 1 | 610 | 6 |
| 380 | 4 | 457 | 7 | 534 | 4 | 611 | 2 |
| 381 | 6 | 458 | 1 | 535 | 6 | 612 | 7 |
| 382 | 4 | 459 | 0 | 536 | 1 | 613 | 1 |
| 383 | 4 | 460 | 7 | 537 | 6 | 614 | 1 |
| 384 | 3 | 461 | 0 | 538 | 3 | 615 | 6 |
| 385 | 4 | 462 | 6 | 539 | 7 | 616 | 3 |

TABLE 7C

| Position | FA9 | Position | FA10 | Position | FA11 | Position | FA12 |
|---|---|---|---|---|---|---|---|
| 617 | 1 | 694 | 4 | 771 | 6 | 848 | 1 |
| 618 | 4 | 695 | 4 | 772 | 3 | 849 | 4 |
| 619 | 5 | 696 | 0 | 773 | 0 | 850 | 6 |
| 620 | 6 | 697 | 5 | 774 | 5 | 851 | 1 |
| 621 | 3 | 698 | 7 | 775 | 2 | 852 | 4 |
| 622 | 1 | 699 | 0 | 776 | 4 | 853 | 1 |
| 623 | 6 | 700 | 4 | 777 | 5 | 854 | 4 |
| 624 | 0 | 701 | 5 | 778 | 3 | 855 | 5 |
| 625 | 6 | 702 | 0 | 779 | 1 | 856 | 6 |
| 626 | 2 | 703 | 6 | 780 | 4 | 857 | 1 |
| 627 | 7 | 704 | 7 | 781 | 4 | 858 | 6 |
| 628 | 1 | 705 | 0 | 782 | 7 | 859 | 0 |
| 629 | 2 | 706 | 4 | 783 | 2 | 860 | 6 |
| 630 | 6 | 707 | 5 | 784 | 2 | 861 | 1 |
| 631 | 3 | 708 | 1 | 785 | 4 | 862 | 4 |
| 632 | 0 | 709 | 7 | 786 | 6 | 863 | 7 |
| 633 | 7 | 710 | 2 | 787 | 1 | 864 | 3 |
| 634 | 2 | 711 | 2 | 788 | 4 | 865 | 0 |
| 635 | 7 | 712 | 6 | 789 | 5 | 866 | 6 |
| 636 | 2 | 713 | 2 | 790 | 2 | 867 | 3 |
| 637 | 3 | 714 | 2 | 791 | 7 | 868 | 1 |
| 638 | 0 | 715 | 5 | 792 | 2 | 869 | 6 |
| 639 | 5 | 716 | 0 | 793 | 3 | 870 | 2 |
| 640 | 4 | 717 | 5 | 794 | 3 | 871 | 5 |
| 641 | 7 | 718 | 6 | 795 | 2 | 872 | 0 |
| 642 | 0 | 719 | 1 | 796 | 5 | 873 | 7 |
| 643 | 7 | 720 | 4 | 797 | 0 | 874 | 3 |
| 644 | 0 | 721 | 7 | 798 | 6 | 875 | 7 |
| 645 | 7 | 722 | 3 | 799 | 6 | 876 | 0 |
| 646 | 2 | 723 | 3 | 800 | 2 | 877 | 1 |
| 647 | 1 | 724 | 2 | 801 | 3 | 878 | 6 |
| 648 | 7 | 725 | 1 | 802 | 3 | 879 | 4 |
| 649 | 2 | 726 | 6 | 803 | 0 | 880 | 2 |
| 650 | 2 | 727 | 0 | 804 | 6 | 881 | 4 |
| 651 | 4 | 728 | 7 | 805 | 6 | 882 | 4 |
| 652 | 6 | 729 | 5 | 806 | 0 | 883 | 7 |
| 653 | 0 | 730 | 1 | 807 | 5 | 884 | 2 |
| 654 | 5 | 731 | 6 | 808 | 4 | 885 | 0 |
| 655 | 5 | 732 | 0 | 809 | 1 | 886 | 6 |
| 656 | 0 | 733 | 4 | 810 | 4 | 887 | 5 |
| 657 | 5 | 734 | 7 | 811 | 5 | 888 | 0 |
| 658 | 4 | 735 | 2 | 812 | 6 | 889 | 4 |
| 659 | 1 | 736 | 2 | 813 | 2 | 890 | 4 |
| 660 | 7 | 737 | 7 | 814 | 2 | 891 | 5 |
| 661 | 2 | 738 | 2 | 815 | 4 | 892 | 7 |
| 662 | 4 | 739 | 0 | 816 | 7 | 893 | 2 |
| 663 | 0 | 740 | 4 | 817 | 1 | 894 | 0 |
| 664 | 5 | 741 | 7 | 818 | 0 | 895 | 7 |
| 665 | 6 | 742 | 3 | 819 | 7 | 896 | 1 |
| 666 | 3 | 743 | 0 | 820 | 3 | 897 | 4 |
| 667 | 2 | 744 | 6 | 821 | 7 | 898 | 7 |
| 668 | 5 | 745 | 6 | 822 | 3 | 899 | 3 |
| 669 | 2 | 746 | 2 | 823 | 0 | 900 | 0 |
| 670 | 4 | 747 | 3 | 824 | 7 | 901 | 5 |
| 671 | 6 | 748 | 0 | 825 | 0 | 902 | 2 |
| 672 | 0 | 749 | 7 | 826 | 5 | 903 | 4 |
| 673 | 7 | 750 | 0 | 827 | 2 | 904 | 6 |
| 674 | 3 | 751 | 4 | 828 | 4 | 905 | 1 |

TABLE 7C-continued

| Position | FA9 | Position | FA10 | Position | FA11 | Position | FA12 |
|---|---|---|---|---|---|---|---|
| 675 | 0 | 752 | 7 | 829 | 6 | 906 | 4 |
| 676 | 7 | 753 | 3 | 830 | 0 | 907 | 3 |
| 677 | 2 | 754 | 0 | 831 | 7 | 908 | 6 |
| 678 | 6 | 755 | 6 | 832 | 2 | 909 | 0 |
| 679 | 1 | 756 | 6 | 833 | 0 | 910 | 7 |
| 680 | 6 | 757 | 2 | 834 | 4 | 911 | 1 |
| 681 | 3 | 758 | 1 | 835 | 4 | 912 | 4 |
| 682 | 1 | 759 | 7 | 836 | 6 | 913 | 7 |
| 683 | 7 | 760 | 3 | 837 | 2 | 914 | 1 |
| 684 | 2 | 761 | 1 | 838 | 7 | 915 | 3 |
| 685 | 0 | 762 | 7 | 839 | 2 | 916 | 1 |
| 686 | 5 | 763 | 0 | 840 | 2 | 917 | 6 |
| 687 | 6 | 764 | 5 | 841 | 7 | 918 | 2 |
| 688 | 3 | 765 | 3 | 842 | 2 | 919 | 4 |
| 689 | 3 | 766 | 7 | 843 | 0 | 920 | 4 |
| 690 | 1 | 767 | 1 | 844 | 4 | 921 | 2 |
| 691 | 5 | 768 | 1 | 845 | 6 | 922 | 4 |
| 692 | 4 | 769 | 5 | 846 | 0 | 923 | 7 |
| 693 | 3 | 770 | 4 | 847 | 7 | 924 | 1 |

The data block contains the ECC protected user data. In one embodiment, it is made up of 2 sections, shown as 806 and 810 in FIG. 8 with a total of 16 sectors (S0–S15) 830 and 15 sector closeout/resynch areas (SCR0–14) 832. Between the two data blocks is the Midamble (MA) 808 which contains another training sequence for the equalizer. FIG. 11 shows the arrangement of the SCR areas. The SCR areas are made up of 4 TSUs for a total of 348 marks. After the initial 10 mark $A/T_P$ pattern 1105, the next 18 Sector Closeout marks 1110 are used to zero out the Running Digital Sum (RDS) of each sector.

In an 8 level system, upon entering the SCR, the RDS=$\Sigma$ (2*mark−7), where the sum is over all the DCC, Data, and TCU marks in previous sector, plus any residual RDS that may not have been completely cleared by previous Sector Closeout sections. In the rare occurrence that the SCR cannot zero out the RDS any residual value is carried into the next section. The algorithm for the mark assignment in the SCR is given by the following steps:

1) Minimize the Block RDS by writing a 0, 3, 4, or 7 mark. Specifically, take the current RDS and
   decrement by 7 for a mark zero.
   decrement by 1 for a mark three.
   increment by 1 for a mark four.
   increment by 7 for a mark seven.
   The choice is based on which one achieves the minimum absolute value of the RDS. If two marks give the same value then the lowest value of the mark (i.e. prefer a 0 to a 3 . . . ) is chosen
2) Step 1 is repeated until the end of the sector close out section. Once the RDS=0, the marks alternate between 3 and 4. In the rare event that 18 marks may not be enough to zero the RDS, any residual value will be carried over until the next sector.

The second section of the SCR (Timing Resynch) 1115 is 320 marks long and is used for the reacquisition of timing in the event that the PLL loses lock. This sequence is similar to the TA 820 and TZL 822 except it contains A/T patterns and is shorter. It consists of repeated patterns of {0 0 0 7 7 7} between the DC closeout 1110 and the second A/T pattern, and also between the second and third A/T pattern. This allows the PLL to lock-up if necessary. Starting with the fourth A/T pattern a sequence of dropped edges allows the synch detector to recognize the end of the high-gain timing acquisition region and allows the PLL to switch to the tracking mode. The pattern of missing edges is given by 0 1

0 1 1 1 1 0 0 0 1 0 0 1 1, where a 0 represents a missing transition and a 1 represents a transition. The sequence is finished with more repeated patterns of {0 0 0 7 7 7}. The 4 SCR timing subunits are listed below:

A/T$_P$, 18 Marks of DC Close Out, Resynch 1 (positions 1–59),

A/T$_N$, Resynch 2 (positions 60–136),

A/T$_P$, Resynch 3 (positions 137–213),

A/T$_N$, Resynch 4 (positions 214–290),

The sequences for Resynch 2, Resynch 3, Resynch 3 and Resynch 4 are given in Table 8.

TABLE 8

| Position | Resynch 1 | Position | Resynch 2 | Position | Resynch 3 | Position | Resynch 4 |
|---|---|---|---|---|---|---|---|
| 1 | 7 | 60 | 0 | 137 | 7 | 214 | 0 |
| 2 | 0 | 61 | 7 | 138 | 0 | 215 | 7 |
| 3 | 0 | 62 | 7 | 139 | 0 | 216 | 7 |
| 4 | 0 | 63 | 7 | 140 | 0 | 217 | 7 |
| 5 | 7 | 64 | 0 | 141 | 7 | 218 | 0 |
| 6 | 7 | 65 | 0 | 142 | 7 | 219 | 0 |
| 7 | 7 | 66 | 0 | 143 | 7 | 220 | 0 |
| 8 | 0 | 67 | 7 | 144 | 0 | 221 | 7 |
| 9 | 0 | 68 | 7 | 145 | 0 | 222 | 7 |
| 10 | 0 | 69 | 7 | 146 | 0 | 223 | 7 |
| 11 | 7 | 70 | 0 | 147 | 7 | 224 | 0 |
| 12 | 7 | 71 | 0 | 148 | 7 | 225 | 0 |
| 13 | 7 | 72 | 0 | 149 | 7 | 226 | 0 |
| 14 | 0 | 73 | 7 | 150 | 0 | 227 | 0 |
| 15 | 0 | 74 | 7 | 151 | 0 | 228 | 0 |
| 16 | 0 | 75 | 7 | 152 | 0 | 229 | 0 |
| 17 | 7 | 76 | 0 | 153 | 7 | 230 | 0 |
| 18 | 7 | 77 | 0 | 154 | 7 | 231 | 0 |
| 19 | 7 | 78 | 0 | 155 | 7 | 232 | 0 |
| 20 | 0 | 79 | 7 | 156 | 0 | 233 | 0 |
| 21 | 0 | 80 | 7 | 157 | 0 | 234 | 0 |
| 22 | 0 | 81 | 7 | 158 | 0 | 235 | 0 |
| 23 | 7 | 82 | 0 | 159 | 7 | 236 | 7 |
| 24 | 7 | 83 | 0 | 160 | 7 | 237 | 7 |
| 25 | 7 | 84 | 0 | 161 | 7 | 238 | 7 |
| 26 | 0 | 85 | 7 | 162 | 0 | 239 | 7 |
| 27 | 0 | 86 | 7 | 163 | 0 | 240 | 7 |
| 28 | 0 | 87 | 7 | 164 | 0 | 241 | 7 |
| 29 | 7 | 88 | 0 | 165 | 7 | 242 | 7 |
| 30 | 7 | 89 | 0 | 166 | 7 | 243 | 7 |
| 31 | 7 | 90 | 0 | 167 | 7 | 244 | 7 |
| 32 | 0 | 91 | 7 | 168 | 0 | 245 | 0 |
| 33 | 0 | 92 | 7 | 169 | 0 | 246 | 0 |
| 34 | 0 | 93 | 7 | 170 | 0 | 247 | 0 |
| 35 | 7 | 94 | 0 | 171 | 7 | 248 | 7 |
| 36 | 7 | 95 | 0 | 172 | 7 | 249 | 7 |
| 37 | 7 | 96 | 0 | 173 | 7 | 250 | 7 |
| 38 | 0 | 97 | 7 | 174 | 0 | 251 | 7 |
| 39 | 0 | 98 | 7 | 175 | 0 | 252 | 7 |
| 40 | 0 | 99 | 7 | 176 | 0 | 253 | 7 |
| 41 | 7 | 100 | 0 | 177 | 7 | 254 | 0 |
| 42 | 7 | 101 | 0 | 178 | 7 | 255 | 0 |
| 43 | 7 | 102 | 0 | 179 | 7 | 256 | 0 |
| 44 | 0 | 103 | 7 | 180 | 0 | 257 | 7 |
| 45 | 0 | 104 | 7 | 181 | 0 | 258 | 7 |
| 46 | 0 | 105 | 7 | 182 | 0 | 259 | 7 |
| 47 | 7 | 106 | 0 | 183 | 7 | 260 | 0 |
| 48 | 7 | 107 | 0 | 184 | 7 | 261 | 0 |
| 49 | 7 | 108 | 0 | 185 | 7 | 262 | 0 |
| 50 | 0 | 109 | 7 | 186 | 0 | 263 | 7 |
| 51 | 0 | 110 | 7 | 187 | 0 | 264 | 7 |
| 52 | 0 | 111 | 7 | 188 | 0 | 265 | 7 |
| 53 | 7 | 112 | 0 | 189 | 7 | 266 | 0 |
| 54 | 7 | 113 | 0 | 190 | 7 | 267 | 0 |
| 55 | 7 | 114 | 0 | 191 | 7 | 268 | 0 |
| 56 | 0 | 115 | 7 | 192 | 0 | 269 | 7 |
| 57 | 0 | 116 | 7 | 193 | 0 | 270 | 7 |
| 58 | 0 | 117 | 7 | 194 | 0 | 271 | 7 |
| 59 | 7 | 118 | 0 | 195 | 7 | 272 | 0 |
|  |  | 119 | 0 | 196 | 7 | 273 | 0 |
|  |  | 120 | 0 | 197 | 7 | 274 | 0 |
|  |  | 121 | 7 | 198 | 0 | 275 | 7 |
|  |  | 122 | 7 | 199 | 0 | 276 | 7 |
|  |  | 123 | 7 | 200 | 0 | 277 | 7 |
|  |  | 124 | 0 | 201 | 7 | 278 | 0 |
|  |  | 125 | 0 | 202 | 7 | 279 | 0 |
|  |  | 126 | 0 | 203 | 7 | 280 | 0 |

TABLE 8-continued

| Position | Resynch 1 | Position | Resynch 2 | Position | Resynch 3 | Position | Resynch 4 |
|---|---|---|---|---|---|---|---|
| | | 127 | 7 | 204 | 0 | 281 | 7 |
| | | 128 | 7 | 205 | 0 | 282 | 7 |
| | | 129 | 7 | 206 | 0 | 283 | 7 |
| | | 130 | 0 | 207 | 7 | 284 | 0 |
| | | 131 | 0 | 208 | 7 | 285 | 0 |
| | | 132 | 0 | 209 | 7 | 286 | 0 |
| | | 133 | 7 | 210 | 0 | 287 | 7 |
| | | 134 | 7 | 211 | 0 | 288 | 7 |
| | | 135 | 7 | 212 | 0 | 289 | 7 |
| | | 136 | 0 | 213 | 7 | 290 | 0 |

Figure 12:
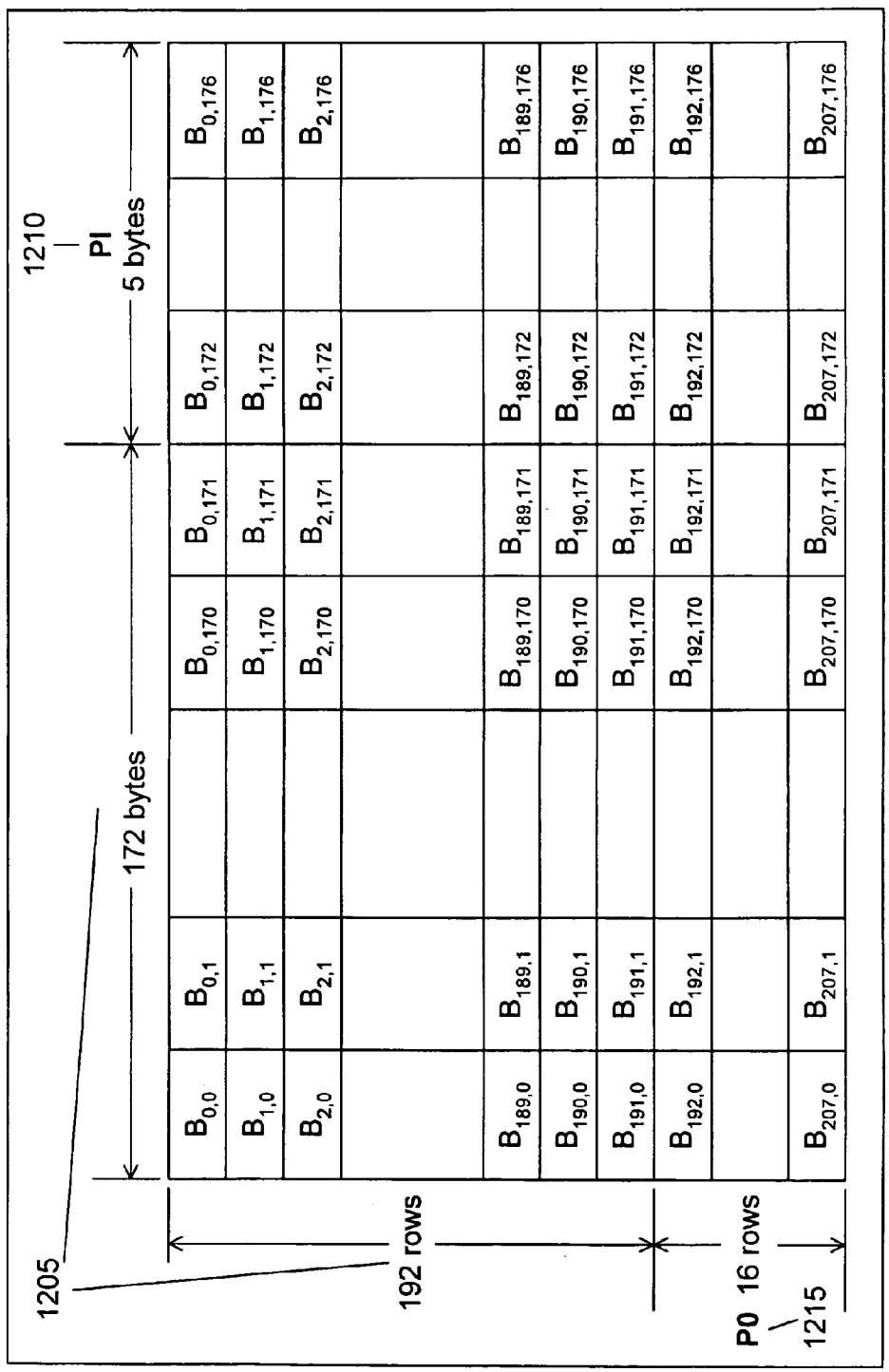
FIG. 12 illustrates an ECC protected data block.

Referring to FIG. 12, the ECC encoding starts with a block of data and adds both an inner 1210 and outer 1215 parity (PI+PO). The data block is arranged into 192 rows by 172 columns to which 16 rows and 5 columns of parity are added. In one embodiment the 5 bytes of inner parity are the first 5 bytes of a punctured 10-byte Reed-Solomon codeword. This gives an ECC row of 177 bytes.

The rows 834, FIG. 8, are then rearranged to form sectors 830 where after every 12 rows of data, one of the outer parity rows is added to produce a sector of 13 rows. Each 177-byte row is then packed in to the row structure 836 TSA, TSB, TSB, TSB, TSD, TSB, TSB, TSC. The bytes are packed in to the marks as described in Table 9.

TABLE 9

| 1 Row = 177 bytes | |
|---|---|
| TSA, TSB, TSB, TSB stores 90 bytes | TSD, TSB, TSB, TSC stores 87 bytes |
| bits for mark conversion: 90 bytes = 720 bits | 4 bits added for mark conversion: 87 bytes + 4 bits = 700 bits |
| 2.5 bits are encoded per data mark: 720/2.5 = 288 marks | 2.5 bits are encoded per data mark: 700/2.5 = 280 marks |
| TSA, TSB, TSB = 66 + 74 + 74 + 74 = 288 data marks | TSD, TSB, TSB, TSC = 66 + 74 + 74 + 66 = 280 data marks |

The rows are composed of 4 different timing subunits (TSA 840, TSB 842, TSC 844, and TSD 846). Each timing subunit is 87 marks long. Each row contains 8 timing subunits. The TSA structure contains an AGC/timing field (A/T) 848, DC control fields (DCC) 852, an ECC row data synch pattern (Dsyn) 850, and data 854. The TSB structure contains an AGC/timing field (A/T), DC control fields (DCC), and data. The TSC structure contains an AGC/timing field (A/T), DC control fields (DCC), data and a trellis close-out section (TCU) 856. The TSD structure contains an AGC/timing field (A/T), DC control fields (DCC), data and a trellis close-out section (TCU) 856. The mark counts are shown in Table 10 for the different timing subunits.

TABLE 10

| Timing Subunit A | | Timing Subunit B | | Timing Subunit C | | Timing Subunit D | |
|---|---|---|---|---|---|---|---|
| Mark Type | # of Marks | Mark Type | # of Marks | Mark Type | # of Marks | Mark Type | # of Marks |
| A/T | 10 | A/T | 10 | A/T | 10 | A/T | 10 |
| Dsyn | 8 | DCC | 1 | DCC | 1 | DCC | 1 |
| DCC | 1 | Data | 25 | Data | 25 | TCU | 8 |

TABLE 10-continued

| Timing Subunit A | | Timing Subunit B | | Timing Subunit C | | Timing Subunit D | |
|---|---|---|---|---|---|---|---|
| Mark Type | # of Marks | Mark Type | # of Marks | Mark Type | # of Marks | Mark Type | # of Marks |
| Data | 22 | DCC | 1 | DCC | 1 | Data | 17 |
| DCC | 1 | Data | 24 | Data | 24 | DCC | 1 |
| Data | 22 | DCC | 1 | DCC | 1 | Data | 24 |
| DCC | 1 | Data | 25 | Data | 17 | DCC | 1 |
| Data | 22 | | | TCU | 8 | Data | 25 |

The Dsyn data synchronization pattern at the beginning of each row is a sequence of 8 marks indicating the row's position within the sector. There are 13 different Dsyn patterns chosen to be as distinct as possible from user data. Each Dsyn pattern must be DC balanced, since it does not occur within a DCC block. The patterns start with 1, 2, 5, or 6 in order to be distinct from a DCC mark which are the only other possible symbols after an A/T pattern. The patterns also end with 1, 2, 5, or 6 to minimize alignment errors since a DCC mark will follow the Dsyn. The pattern chosen is also one that cannot be generated when the trellis encoder is in one of the first two possible states, state 0 and state 0, 23, 98, or 117. Finally the patterns were chosen to have long sequences of repeated marks. The Dsyn patterns are shown in Table 11.

TABLE 11

| Row | Dsyn Pattern | | | | | | | |
|---|---|---|---|---|---|---|---|---|
| 0 | 1 | 1 | 1 | 1 | 6 | 6 | 6 | 6 |
| 1 | 1 | 1 | 4 | 4 | 4 | 4 | 5 | 5 |
| 2 | 1 | 1 | 6 | 6 | 6 | 6 | 1 | 1 |
| 3 | 2 | 2 | 2 | 2 | 5 | 5 | 5 | 5 |
| 4 | 2 | 2 | 3 | 3 | 3 | 3 | 6 | 6 |
| 5 | 2 | 2 | 5 | 5 | 5 | 5 | 2 | 2 |
| 6 | 5 | 5 | 2 | 2 | 2 | 2 | 5 | 5 |
| 7 | 5 | 5 | 4 | 4 | 4 | 4 | 1 | 1 |
| 8 | 5 | 5 | 5 | 5 | 2 | 2 | 2 | 2 |
| 9 | 5 | 5 | 7 | 7 | 1 | 1 | 1 | 1 |
| 10 | 6 | 6 | 1 | 1 | 1 | 1 | 6 | 6 |
| 11 | 6 | 6 | 3 | 3 | 3 | 3 | 2 | 2 |
| 12 | 6 | 6 | 6 | 6 | 1 | 1 | 1 | 1 |

The DCC marks are chosen to minimize the RDS of the following data marks. The DCC may take on a value of 0, 3, 4, or 7 for the mark. A mark of 3 or 4 indicates that the following data, including the TCU if any, is inverted.

Figure 13:
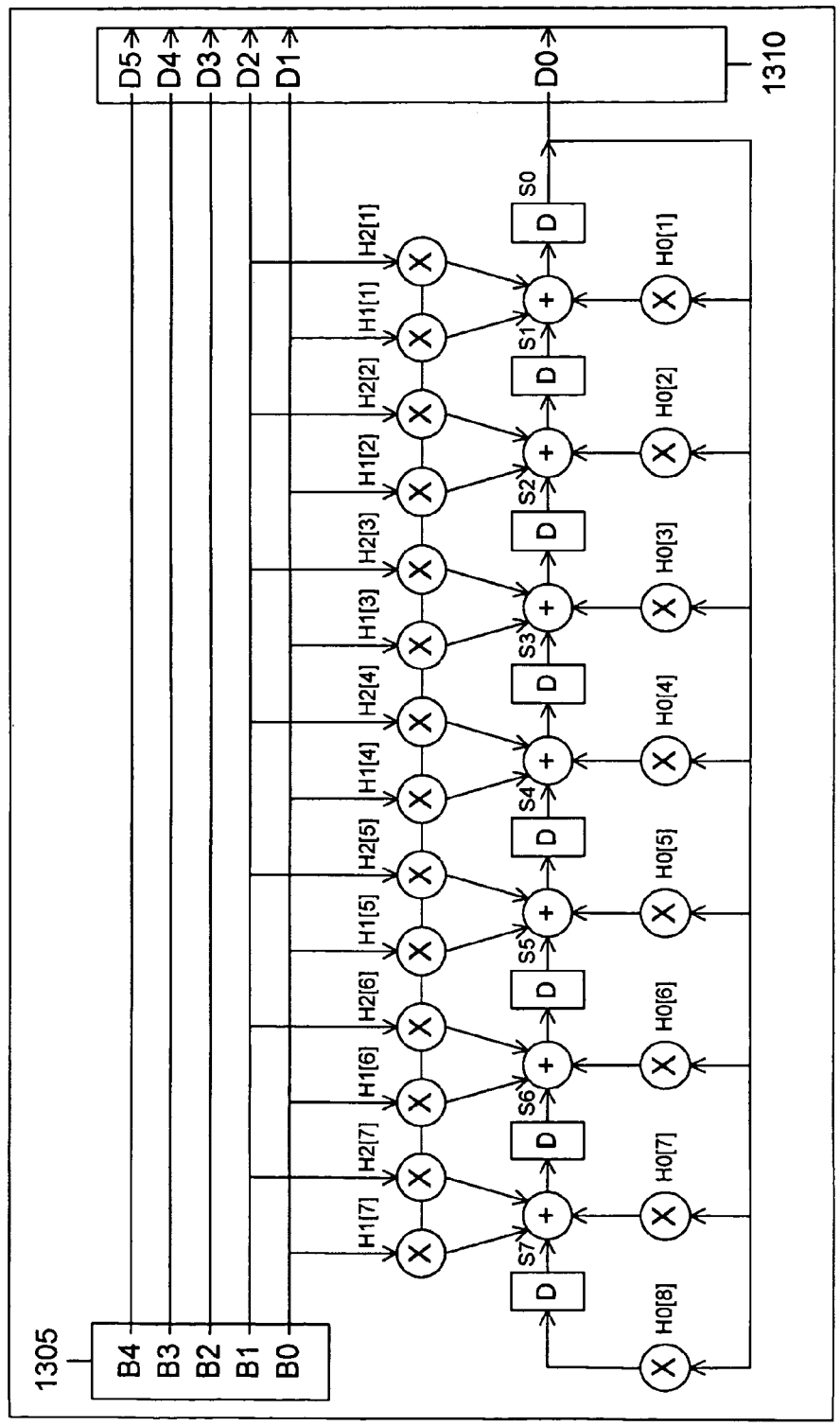
FIG. 13 is a diagram for a convolutional encoder.

In one embodiment the ECC encoded data is convolutionally encoded. FIG. 13 shows a convolutional encoder. First the data is convolutionally encoded so that 5-bits of user data 1305 are encoded into 6-bits 1310 which in turn are encoded into two marks. The encoder can support the maximum constraint length=8. It is programmable through the enable bits H0[8:0], H1[7:0], H2[7:0]. Table 12 shows the possible settings of the Trellis Encoder in octal.

TABLE 12

| Constraint Length | H0 | H1 | H2 |
|---|---|---|---|
| 3 | 11 | 02 | 04 |
| 4 | 23 | 04 | 16 |
| 5 | 41 | 06 | 10 |
| 6 | 101 | 016 | 064 |
| 7 | 203 | 014 | 042 |
| 8 | 401 | 056 | 304 |

Table 13 below shows the mapping 6 bits into 2 marks. Since the 6-bits represent 64 values and an 8-level system has 64 states for 2 marks, there are no illegal mark pairs.

TABLE 13

| Second Mark (D5, D4, D3, where D5 is MSB) | 7 | 0 | 5 | 20 | 17 | 16 | 21 | 4 | 1 |
|---|---|---|---|---|---|---|---|---|---|
| | 6 | 15 | 10 | 27 | 30 | 31 | 26 | 11 | 14 |
| | 5 | 60 | 57 | 40 | 45 | 44 | 41 | 56 | 61 |
| | 4 | 51 | 54 | 39 | 34 | 35 | 38 | 55 | 50 |
| | 3 | 48 | 53 | 36 | 33 | 32 | 37 | 52 | 49 |
| | 2 | 63 | 58 | 43 | 46 | 47 | 42 | 59 | 62 |
| | 1 | 12 | 9 | 24 | 29 | 28 | 25 | 8 | 13 |
| | 0 | 3 | 6 | 23 | 18 | 19 | 22 | 7 | 2 |
| | | 0 | 1 | 2 | 3 | 4 | 5 | 6 | 7 |
| | | First Mark (D2, D1, D0, where D2 is MSB) | | | | | | | |

Twice per row, the trellis is closed out in order to limit the traceback depth and to limit the propagation of Viterbi induced error events. This is done by using a restricted set of states at the end of one of these intervals in order to guarantee that the trellis will be in a given state at the end of the close out. This anchors the decoder and provides extra knowledge for the traceback. The chosen state is 0, and the available states are reduced by a factor of 4 at each stage until at the end of 4 steps, the 0 state is the only choice. This process thus adds 16 marks to each row.

The midamble (MA) 808 repeats the level calibration sequence (LC) 826 and the fractionally spaced equalizer training area (FA) 828 to allow twice-per-block adaptation of the fractionally spaced equalizer. The level calibration sequence (LC) is designed to provide level information that is not affected by intersymbol interference. The sequence is given in Table 6 above. The fractionally spaced equalizer training sequence (FA) is designed to provide level information that is broadband and DC free to train the equalizer taps. The sequence is given in Tables 7A, 7B, and 7C above.

The postamble 812 is 2 timing subunits long (174 marks), consisting of only A/T patterns and DC control marks. Its purpose is to zero out the Running Digital Sum (RDS) of the ECC block. Upon entering the postamble, the RDS=Σ (2*mark-7), where the sum is over all the DCC, Data, and TCU marks in Data Blocks 1 & 2. All other parts of the physical blocks should be independently DC balanced. The algorithm for the mark assignment in the postamble is given by the following:

1) Minimize the Block RDS by writing a 0, 3, 4, or 7.
   Specifically, take the current RDS and
   decrement by 7 for a mark zero.
   decrement by 1 for a mark three.
   increment by 1 for a mark four.
   increment by 7 for a mark seven.

The choice based on which one achieves the minimum absolute value of the RDS. If two marks give the same value then choose the lowest value of the mark (i.e.prefer a 0 to a 3 . . . )

2). Repeat step 1 until the end of the clean up section. Once RDS=0, the marks will alternate between the values 3 and 4.

FIG. 14 depicts an overall view of a disc having Address In Pregroove and containing three main areas, lead-in (LIA) 1405, lead-out (LOA) 1410, and data area (DA) 1415. The Address in Pregroove (AIP) is designed to provide addressing information for the disc player independent of information written in the data blocks. In the prefered embodiment, the AIP information is modulated on a carrier and then placed on the recording track of a recordable optical media during the manufacture of the media. In one embodiment there are 5 AIP frames per data block. The FIG. 14 shows the layout of the spiral track represented as one long line.

The lead-in area 1405 is reserved for system and media information and the AIP format contains special information in this area in addition to addressing information. The data area 1405 contains AIP frames with only addressing information. The lead-out area 1415 contains AIP frames with only addressing information.

The lead-in area is reserved for system and media information and special information in the AIP reserve bits. There are 5 AIP addresses for each of the 1024 physical information blocks. This area is addressed using the following:

AIP LIA address=−5120 corresponding to LIA start block address=−1024

AIP LIA address=−5 corresponding to LIA end block address=−1

The data area contains user information. There are 5 AIP addresses for each of the 61036 physical information blocks. This area is addressed using the following:

AIP DA address=0 corresponding to DA start block address=0

AIP DA address=305,175 corresponding to DA end block address=61,035

The lead-out area is reserved for system and media information. There are 5 AIP addresses for each of the 523 physical information blocks. This area is addressed using the following:

AIP LOA address=305,180 corresponding to LOA start block address=61,036

AIP LOA address=307,780 corresponding to LOA end block address=61,558

FIG. 15 shows the arrangement of the bits in an AIP frame. The AddressC,B,A 1505 are incremented monotonically. Since there are 5 AIP frames per physical block, the physical block address is equal to the AddressC,B,A/5. Table 15 depicts parameters associated with one embodiment.

TABLE 15

| | |
|---|---|
| carrier frequency | 88.20 KHz (at 4× speed or 4.8 m/s) |
| Modulation | FM biphase-mark (00 or 11 for 0, 01 or 10 for 1, transition guaranteed at beginning of bit) Biphase clock 25.200 KHz Bit rate clock 12.600 KHz (7 wobble oscillations per bit) 1 KHz ± 10% deviation <−40dB THD sine wave oscillator output |
| data bit-rate | 12600 bits/sec (at 4× speed or 4.8 m/s |
| frame length | 49 bits |
| Frame synch mark | 11100001111000 if preceding cell is a 0 00011110000111 if preceding cell is a 1 (these are both dc balanced biphase violations) |

TABLE 15-continued

| | |
|---|---|
| Special Info Area | Default Special Info Case = 1111 |
| Data format | AddressC: (C1 . . . C8) MSBit (C1) on position 12 |
| | AddressB: (B1 . . . B8) MSBit (B1) on position 20 |
| | AddressA: (A1 . . . A8) MSBit (A1) on position 28 |
| | Address C, B, A are a 3-byte signed integer |
| | (000001h = 1 and FFFFFFh = −1) |
| Error Protection | 14-bit CRC is used on bits 8–35 |
| | (MSBit = 8 LSBit = 35) of the AIP frame. |
| | CRC Bits 36–49 are inverted on the disc. |
| | The check polynomial is: |
| | $P(x) = x^{14} + x^{12} + x^{10} + x^7 + x^4 + x^2 + 1$ |

The LIA 1405 section contains system, media, and special information stored in the AIP. This information is grouped into blocks (corresponding to Physical Blocks). Information is limited to starting parameters for writing and reading. There are 3 different types of AIP blocks: Types 0, 1, and 2. AIP Block Type 0 is followed by one to four pairs of AIP Block Type 1 and 2. The number of pairs is determined by the number of reference speeds. This information appears in the Lead-in Area starting at address AIP LIA address=−5120 and is repeated as many times as the complete information will fit into the lead in area. For the case of four speeds the total information stored would require 9×5=45 AIP frames, and would be repeated 113 times and occupy AIP addresses −5120 to −36.

Figures 18, 19:
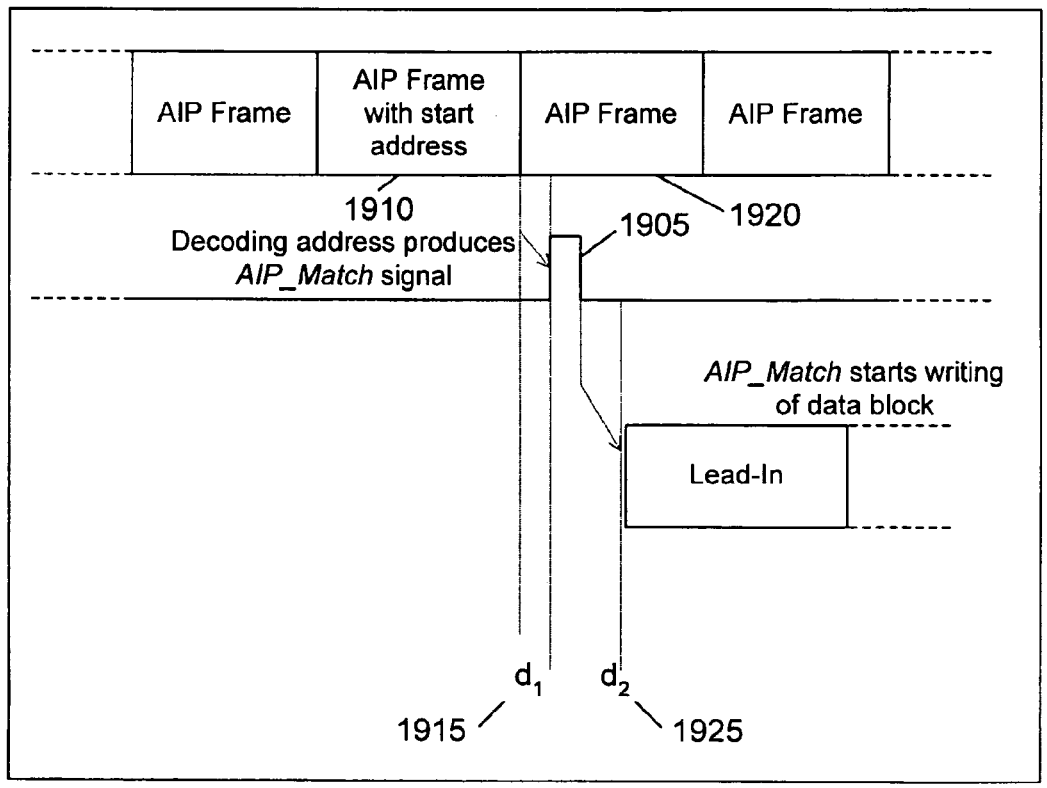
FIG. 18 illustrates a type 2 AIP frame.
FIG. 19 shows the synchronization of a start of an information block write with the AIP.

FIGS. 16, 17 and 18 show the layout for the information bits stored in the reserve bits of the AIP frames corresponding to Type 0, Type 1 and Type 2 blocks respectively. Each block contains information in the 20 reserve bits (4 bits/AIP frame*5 AIP frames/AIP block). As shown in FIG. 16, AIP block type 0 will start off with a 4 bit sync word 1605 of all 1s. For all fields in the special information, a value of all 1s is forbidden. This guarantees that the data in the special information cannot emulate the sync. Table 16 details the type of information stored in the reserve bits corresponding to the lauout of FIGS. 16, 17 and 18.

TABLE 16

| | |
|---|---|
| AIP Block Type | B1, B2 |
| Additional Info Bits | AA1, AA2 |
| Disk Type | D1, D2, D3, D4 |
| Disc Use Application | U1, U2, U3, U4 |
| Number of Reference Speeds | N1, N2 |
| Additional Info Bits | AB1, AB2 |
| For each reference speed(i), the following data will be stored | |
| Reference Speed(i) | S1(i), S2(i) |
| Power, Melt(i) | PM1(i), PM2(i), PM3(i), PM4(i) |
| Power, Growth(i) | PG1(i), PG2(i), PG3(i), PG4(i) |
| Additional Info Bits(i) | AC1(i), AC2(i), AC3(i), AC4(i), AC5(i), AC6(i), AC7(i), AC8(i) |
| Time, Melt | TM1(i), TM2(i), TM3(i), TM4(i) |
| Time, Growth Bottom(i) | TB1(i), TB2(i), TB3(i), TB4(i) |
| Time, Growth Top(i) | TT1(i), TT2(i).TT3(i), TT4(i) |
| Additional Info Bits(i) | AD1(i), AD2(i), AD3(i), AD4(i) |

The writing of adjacent blocks on the disc poses several problems which the AIP format tries to address. First, media speed or spindle speed must be controlled in order to assure the write strategy is correct. Second, the write clock must be controlled to ensure that, given the spindle speed and the track run-out, the block fits within the AIP wobble address space. And third, the drive-to-drive variation must not allow the overwriting of the previous or next data block.

Each physical block write is independent. Refering to FIG. 19, writing of a data block is synchronized to an AIP_Match signal 1905. After one block is written, the next block is again synchronized to the AIP_Match signal to ensure that any block over-run or under-run does not accumulate during a long write. Decoding of the AIP Frame with start address 1910 produces the AIP Match signal. The AIP_Match signal is synchronized to the wobble clock generated by the wobble PLL. The delay from the end of the AIP Frame is $d1 \pm \Delta_{d1}$ 1915 after the synch mark of the next AIP Frame 1920, where $\Delta_{d1}$ is small compared to a wobble. The starting of a write is $d2 \pm \Delta_{d2}$ 1925 after the AIP_Match signal.

Figure 20:
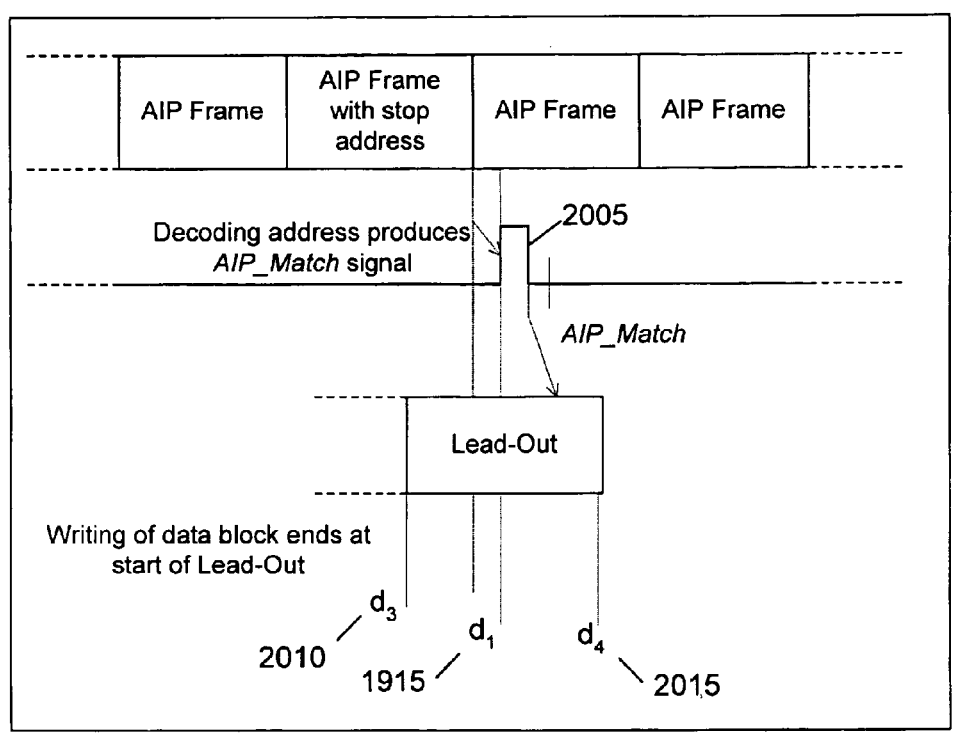
FIG. 20 shows the relationship of the end of the information block write with the AIP.

Refering to FIG. 20 writing stops when it reaches the Lead-Out area $d_3$ 2010. If this occurs after the AIP_Match signal 2005 a write fault is generated and the writing stops at $d4 \pm \Delta_{d4}$ 2015. To prevent data overwrites $d_4$ is less than $d_2$ 1925.

A system for writing data to a multilevel disc and reading data from the multilevel disc has been disclosed. The read system compensates for noise introduced in the read signal by using an adaptive FSE. In addition, precompensation is performed before a signal is written to the disk. Special fields are written to the disc to facilitate clock recovery and automatic gain compensation. Other fields control the DC bias of the signal read from the disk.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. An information block in a multilevel optical data system, said information block comprising:
   a preamble having (i) a timing acquisition area, (ii) a preamble level calibration area, and (iii) an equalizer training area;
   a data block; and
   a postamble.

2. The information block according to claim 1, wherein said preamble includes:
   a time zero locator area; and
   a block address.

3. The information block according to claim 1, wherein said postamble includes timing subunits containing (i) an AGC/timing area and (ii) a DC control area.

4. The information block according to claim 1, further comprising:
   a link-in area prior to said preamble, said link-in area comprising (i) an oscillating mid-level pattern area (ii) and (iii) a link-out area.

5. An information block in a multilevel optical data system comprising:
   a preamble having (i) a timing acquisition area, (ii) a preamble level calibration area, and (iii) a preamble equalizer training area;
   a first data block;
   a midamble having (i) a midamble level calibration area and (ii) a midamble equalizer training area;
   a second data block; and
   a postamble.

6. The information block according to claim 5, wherein said preamble includes (i) a time zero locator area and (ii) a block address.

7. The information block according to claim 5, wherein said postamble includes timing subunits containing (i) an AGC/timing area and (ii) a DC control area.

8. The information block according to claim 5, wherein said first data block and said second data block contain ECC protected data having inner parity and outer parity.

9. The information block according to claim 5, further comprising:
   a link-m area prior to said preamble, said link-in area comprising (i) an oscillating mid-level pattern area and (ii) a link-out area.

10. A multilevel pattern of marks written to an optical disc, comprising:
    a preamble having (i) a timing acquisition area, (ii) a preamble level calibration area, and (iii) an equalizer training area;
    a data block, and
    a postamble.

11. The multilevel pattern according to claim 10, wherein said preamble includes:
    a time zero locator area; and
    a block address.

12. The multilevel pattern according to claim 10, wherein said postamble includes timing subunits containing an AGC/timing area and a DC control area.

13. A multilevel pattern of marks written to an optical disc, said multilevel pattern comprising:
    a preamble comprising (i) a timing acquisition area, (ii) a preamble level calibration area, and (iii) a preamble equalizer training area;
    a first data block;
    a midamble including (i) a midamble level calibration area, and (ii) a midamble equalizer training area;
    a second data block; and
    a postamble.

14. The multilevel pattern according to claim 13, wherein said preamble includes:
    a time zero locator area; and
    a block address.

15. The multilevel pattern according to claim 13, wherein said postamble includes timing subunits containing (i) an AGC/timing area and (ii) a DC control area.

16. The multilevel pattern according to claim 13, wherein said fist data block and said second data block contain ECC protected data having inner parity and outer parity.

17. The multilevel pattern according to claim 13, further including:
    a link-in area prior to said preamble comprising (i) an oscillating mid-level pattern area, and (ii) a link-out area.

18. The multilevel pattern according to claim 17, wherein said ECC protected data has punctured inner parity.

19. The multilevel pattern according to claim 17, wherein said ECC protected data is convolutionally encoded such that m bits are encoded into n bits.

20. The multilevel pattern according to claim 17, where n is greater than m.

* * * * *